(12) United States Patent
Hayashi

(10) Patent No.: US 10,777,688 B2
(45) Date of Patent: Sep. 15, 2020

(54) SEMICONDUCTOR DEVICE AND METHOD OF MANUFACTURING THE SAME

(71) Applicant: RENESAS ELECTRONICS CORPORATION, Tokyo (JP)

(72) Inventor: Tomohiro Hayashi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/191,021

(22) Filed: Nov. 14, 2018

(65) Prior Publication Data
US 2019/0198681 A1   Jun. 27, 2019

(30) Foreign Application Priority Data

Dec. 27, 2017 (JP) ................................. 2017-252431

(51) Int. Cl.
*H01L 29/792* (2006.01)
*H01L 27/11568* (2017.01)
(Continued)

(52) U.S. Cl.
CPC ........ *H01L 29/792* (2013.01); *H01L 27/1157* (2013.01); *H01L 27/11568* (2013.01); *H01L 29/40117* (2019.08); *H01L 29/4234* (2013.01); *H01L 29/42344* (2013.01); *H01L 29/66795* (2013.01); *H01L 29/66818* (2013.01); *H01L 29/66833* (2013.01); *H01L 29/785* (2013.01); *H01L 29/7854* (2013.01)

(58) Field of Classification Search
CPC ............. H01L 29/785; H01L 29/66795; H01L 29/42364; H01L 29/792; H01L 29/78642; H01L 29/7926; H01L 29/7788; H01L 29/66666; H01L 27/11568; H01L 27/0886; H01L 27/0924; H01L 21/823431; H01L 21/823487
See application file for complete search history.

(56) References Cited

U.S. PATENT DOCUMENTS

| 7,504,689 B2 | 3/2009 | Hisamoto et al. |
| 2006/0118876 A1* | 6/2006 | Lee .................. H01L 29/66795 257/365 |

FOREIGN PATENT DOCUMENTS

| EP | 2 026 378 A2 | 2/2009 |
| JP | 2006-041354 A | 2/2006 |
| WO | 2008/062974 A1 | 5/2008 |

OTHER PUBLICATIONS

Extended European Search Report issued in corresponding European Patent Application No. 18207717.2-1212, dated Jul. 18, 2019.

* cited by examiner

*Primary Examiner* — Hsien Ming Lee
(74) *Attorney, Agent, or Firm* — McDermott Will & Emery LLP

(57) ABSTRACT

In a split-gate MONOS memory including a FINFET, occurrence of erroneous write in an unselected cell due to electric field concentration at an upper end of a fin is prevented, and thus reliability of a semiconductor device is improved. An insulating film is formed between an upper surface of a fin and each of a control gate electrode and a memory gate electrode in a memory cell region, so that in a gate insulating film of each of a control transistor and a memory transistor, thickness of a portion on the fin is larger than thickness of a portion covering side surfaces of the fin. The insulating film having a bird's beak at its end portion is formed to round a corner of the fin.

10 Claims, 33 Drawing Sheets

(51) Int. Cl.
*H01L 29/423* (2006.01)
*H01L 29/66* (2006.01)
*H01L 21/28* (2006.01)
*H01L 27/1157* (2017.01)
*H01L 29/78* (2006.01)

FIG. 32

| OPERATION METHOD WRITE/ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|
| A | SSI (WRITE)/ BTBT (ERASE) | 10/5/1/0.5/0 | -6/6/0/open/0 | 0/0/1.5/1.5/0 |

SEMICONDUCTOR DEVICE AND METHOD OF MANUFACTURING THE SAME

CROSS-REFERENCE TO RELATED APPLICATIONS

The disclosure of Japanese Patent Application No. 2017-252431 filed on Dec. 27, 2017 including the specification, drawings and abstract is incorporated herein by reference in its entirety.

BACKGROUND

The present invention relates to a semiconductor device and a method of manufacturing the semiconductor device. Specifically, the invention relates to a technique effectively used for a semiconductor device including a nonvolatile memory including a fin field effect transistor.

A fin field effect transistor is known as a field effect transistor that allows a reduction in leakage current, power consumption, and size while operating at high speed. The fin field effect transistor (FINFET) is, for example, a semiconductor element that has a channel layer including a pattern of a semiconductor layer formed on a substrate, and has a gate electrode formed so as to straddle the pattern.

The electrically erasable and programmable read only memory (EEPROM) is widely used as an electrically writable and erasable, nonvolatile semiconductor memory device. Such a memory device typified by a currently widely used flash memory has a conductive floating gate electrode surrounded by an oxide film or a trapping insulating film below a gate electrode of a MISFET, uses a charge storage state in the floating gate or the trapping insulating film as memory information, and reads the charge storage state as a threshold of the transistor. The trapping insulating film refers to a charge-storable insulating film, and includes, for example, a silicon nitride film. Electric charges are injected or emitted into/from such a charge storage region to shift the threshold voltage of the MISFET, and thus the MISFET is allowed to operate as a memory element. Such a flash memory includes a split-gate cell using a metal-oxide-nitride-oxide-semiconductor (MONOS) film.

Japanese Unexamined Patent Application Publication No. 2006-41354 describes formation of a split-gate MONOS memory including a fin field effect transistor.

SUMMARY

In a MONOS memory cell (MONOS memory) including a FINFET, it is important to maintain disturb (erroneous write) resistance at an unselected cell located close to a selected cell as a write object during write operation. In the unselected cell having the same voltage application condition as that of the selected cell except for a drain voltage, gate induced drain leakage (GIDL) may occur in a channel region due to a potential difference between a fin surface and a control gate electrode directly below a memory gate electrode. If the GIDL occurs, some of electrons may be trapped from within the fin below the memory gate electrode into a trapping insulating film, leading to erroneous write. In the fin field effect transistor, since an electric field concentrates at an upper end and a corner of the fin, disturb resistance is particularly deteriorated.

Other objects and novel features will be clarified from the description of this specification and the accompanying drawings.

Among the embodiments disclosed in this application, typical one is briefly summarized as follows.

In a semiconductor device of one embodiment, an oxide film is formed to cover an upper surface of a fin directly below a control gate electrode configuring a MONOS memory cell, and thickness of the oxide film is larger in a portion covering a corner of the upper surface of the fin than in a portion covering the central portion of the upper surface.

According to one embodiment disclosed in this application, reliability of the semiconductor device can be improved.

BRIEF DESCRIPTION OF THE DRAWINGS

FIG. 32 is a table explaining operation voltages of a split-gate memory cell.

DETAILED DESCRIPTION

Although each of the following embodiments may be dividedly described in a plurality of sections or embodiments for convenience as necessary, they are not unrelated to one another except for the particularly defined case, and are in a relationship where one is a modification, detailed explanation, supplementary explanation, or the like of part or all of another one. In each of the following embodiments, when the number of elements and others (including the number, a numerical value, amount, and a range) is mentioned, the number is not limited to a specified number except for the particularly defined case and for the case where the number is principally clearly limited to the specified number. In other words, the number may be not less than or not more than the specified number.

In each of the following embodiments, a constitutional element (including an element step etc.) of the embodiment is not necessarily indispensable except for the particularly defined case and for the case where the constitutional element is considered to be indispensable in principle. Similarly, in the following embodiment, when a shape of a constitutional element, a positional relationship, and others are described, any configuration substantially closely related to or similar to such a shape or the like should be included except for the particularly defined case and for the case where such a configuration is considered to be not included in principle. The same holds true in the numerical value and the range.

Hereinafter, some embodiments will be described in detail with reference to the accompanying drawings. In all drawings for explaining the embodiments, components having the same function are designated by the same numeral, and duplicated description is omitted. In the following embodiments, the same or similar portion is not repeatedly described in principle except for a particularly required case.

First Embodiment

Structure of Semiconductor Device

Figure 1:
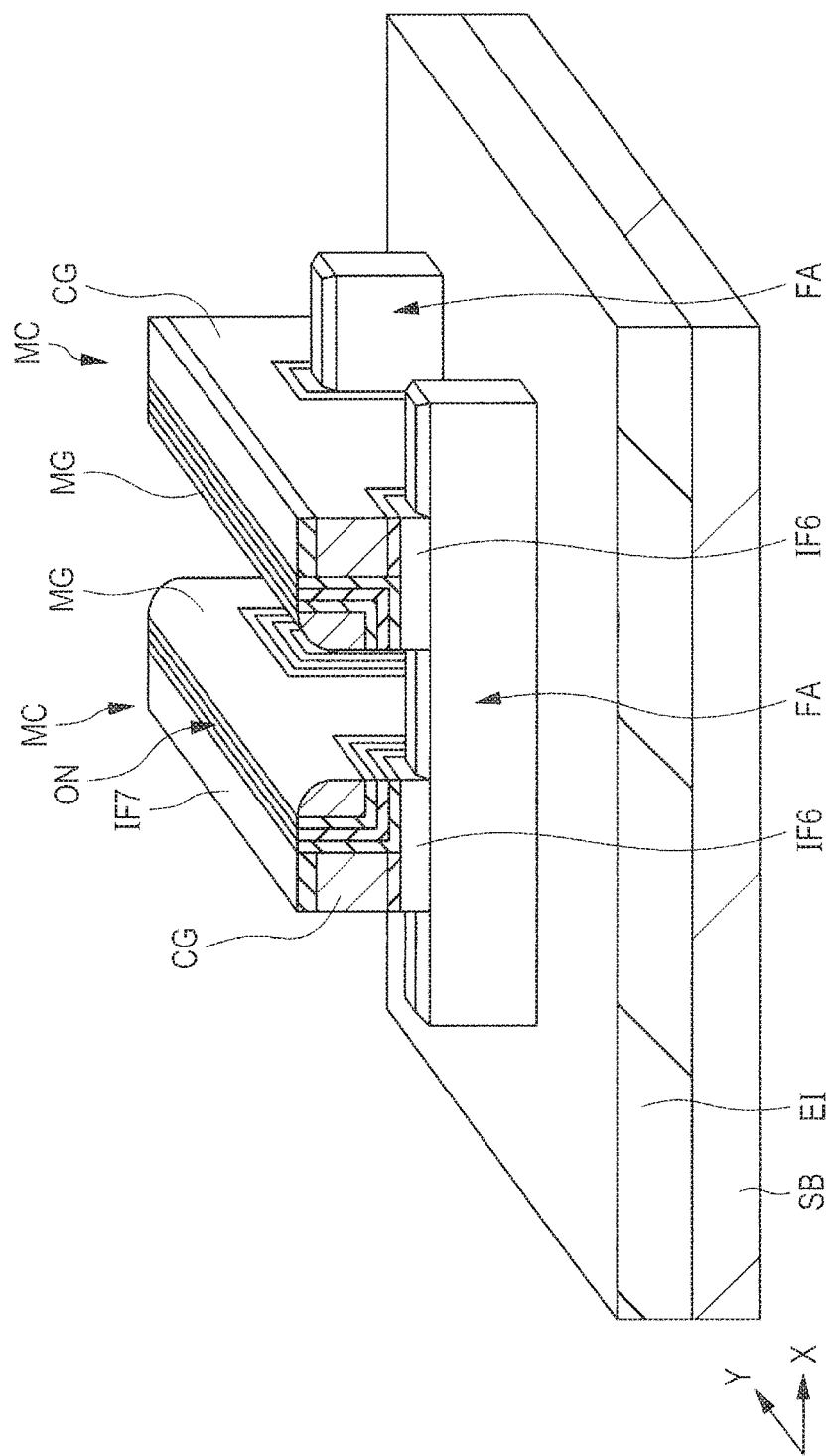
FIG. 1 is a perspective view of a semiconductor device of a first embodiment of the invention.
Figure 2:
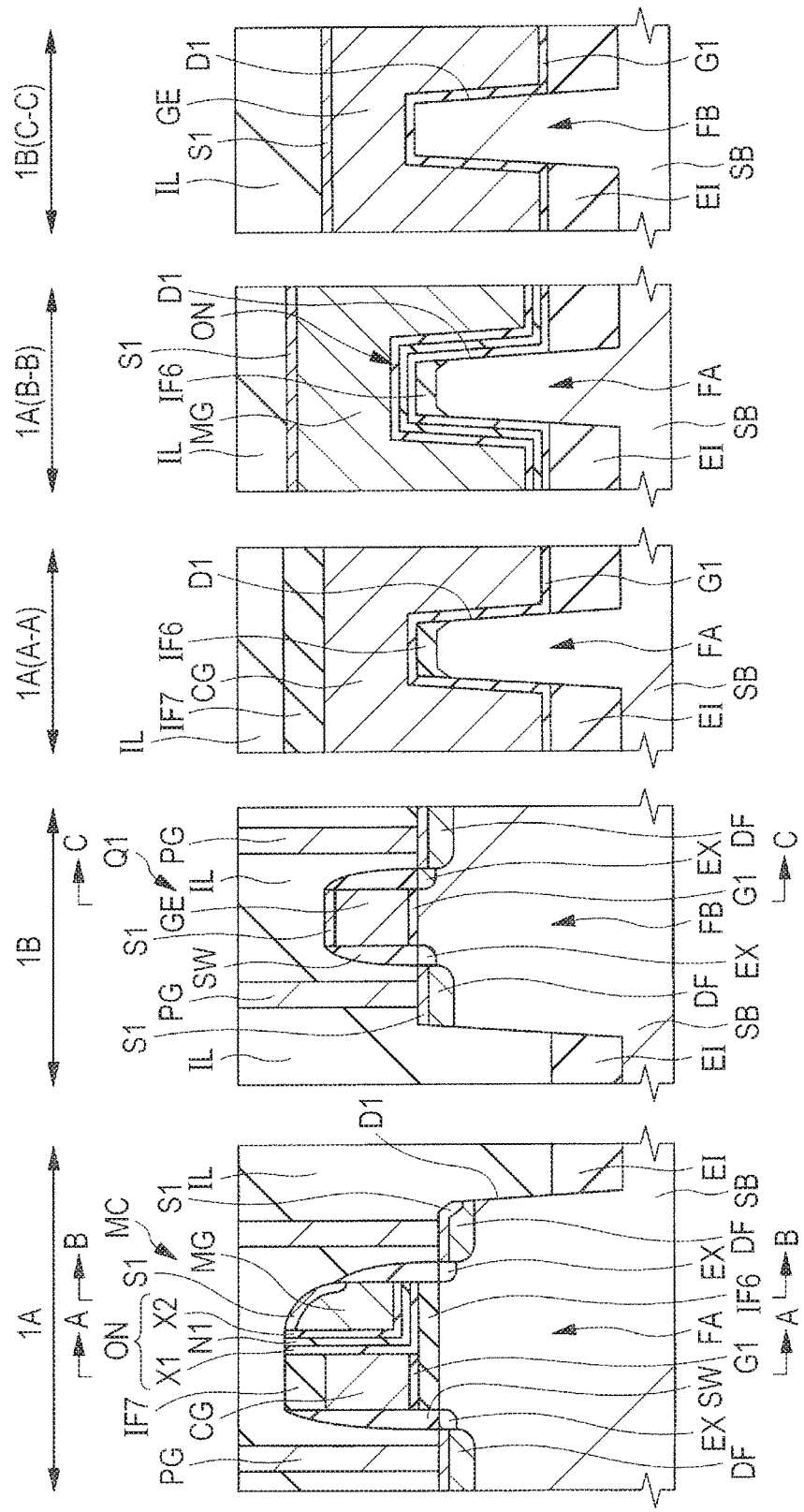
FIG. 2 includes sectional views of the semiconductor device of the first embodiment.
Figure 3:
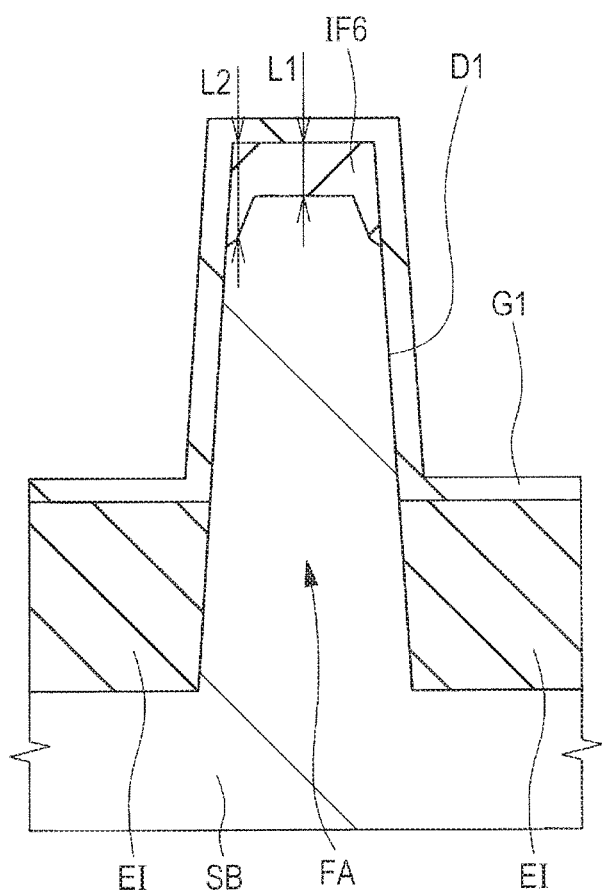
FIG. 3 is an enlarged sectional view of the semiconductor device of the first embodiment.

A semiconductor device of a first embodiment is described below with reference to FIGS. 1 to 3. FIG. 1 is a perspective view of the semiconductor device of the first embodiment. FIG. 2 includes sectional views of the semiconductor device of the first embodiment. FIG. 3 is an enlarged sectional view of the semiconductor device of the first embodiment.

Although FIG. 2 shows a memory cell region 1A and a peripheral region 1B, FIG. 1 shows only the memory cell region. In the memory cell region, a plurality of memory cells as nonvolatile memory elements are arranged in an array. The peripheral region (logic region) is different from the memory cell region, and has a low-withstand-voltage metal insulator semiconductor field effect transistor (MISFET) configuring a logic circuit, for example. The low-withstand-voltage MISFET (low-withstand-voltage transistor) requires a high operation speed and operates at a low voltage compared with a high-withstand-voltage transistor used in a power circuit or the like. FIG. 1 omits illustration of an interlayer insulating film covering a semiconductor substrate and an element, a sidewall spacer, a silicide layer, a plug, and an interconnection layer including an interconnection on the interlayer insulating film.

FIG. 2 shows a section of the memory cell region 1A, a section of the peripheral region (logic region) 1B, a section along a line A-A, a section along a line B-B, and a section along a line C-C. The section along the line A-A mentioned herein includes a section of a control gate electrode CG in the memory cell region 1A in FIG. 2, and is along a short direction of a fin FA. The section along the line B-B mentioned herein includes a section of a memory gate electrode MG in the memory cell region 1A in FIG. 2, and is along the short direction of the fin FA. The section along the line C-C mentioned herein includes a section of a gate electrode GE in the peripheral region 1B in FIG. 2, and is along a short direction of a fin FB. FIG. 2 omits illustration of the interconnection layer including the interconnection on an interlayer insulating film IL.

FIG. 3 shows an enlarged sectional view of the fin FA in a plane along the short direction of the fin FA.

In the semiconductor device of the first embodiment, a split-gate memory cell including two FINFETs (a control transistor and a memory transistor) and a low-withstand-voltage n-type FINFET are mounted on one semiconductor substrate. Although this structure is described with a case where each transistor is formed as an n-type transistor, the following transistors may each be a p-type transistor. When the p-type transistor is formed, an impurity having a different conductivity type may be introduced into each region configuring the following transistor.

Any of the transistors mentioned in this application is a metal insulator semiconductor field effect transistor (MIS- FET), i.e., a MIS field effect transistor, and is a fin field effect transistor (FINFET) having a fin surface as a channel region.

As shown in FIGS. 1 and 2, a memory cell (nonvolatile memory element) MC in the memory cell region 1A is formed on a plate-like fin FA that is part of the semiconductor substrate SB and formed in the upper part of the semiconductor substrate SB. As shown in the peripheral region 1B in FIG. 2, a transistor Q1 as a low-withstand-voltage FINFET is formed on a plate-like fin FB that is part of the semiconductor substrate SB and formed in the upper part of the semiconductor substrate SB.

Each of the fins FA and FB forms a pattern of a semiconductor layer extending along an X direction along the main surface of the semiconductor substrate SB. A width in a Y direction of each of the fins FA and FB along the main surface of the semiconductor substrate SB is extremely smaller than a width in the X direction of each of the fins FA and FB. That is, the X direction is a longitudinal direction and the Y direction is a short direction for the fins FA and FB. Each of the fins FA and FB is a protrusion configuring part of the semiconductor substrate SB. The semiconductor substrate SB is made of single-crystal silicon, for example.

Although two fins FA are shown side by side in the Y direction in FIG. 1, a plurality of fins FA may be formed in the X direction, and three or more fins FA may be arranged in the Y direction. The same holds true for the fin FB (see FIG. 2) in the peripheral region 1B. Although FIG. 1 shows two memory cells MC formed side by side on one fin FA, FIG. 2 shows only one of the two memory cells MC. Three or more memory cells MC may be formed on one fin FA. Similarly, the transistor Q1 shown in FIG. 2 may be a plurality of transistors Q1 formed side by side on one fin FB. A shape of each of the fins FA and FB may not limited to the plate shape (wall shape) extending in one direction, but may be configured by a meandering pattern in plan view, for example.

A trench D1 is formed in the upper surface of the semiconductor substrate SB between the fins FA, between the fins FB, and between the fins FA and FB. That is, each of the side surfaces of the fins FA and FB configures a side surface of the trench D1.

As shown in FIG. 2, an element isolation region (element isolation part) EI is an insulating film that fills part of the trench D1. However, the element isolation region EI does not completely fill the trench D1, and part of the fin FA or FB protrudes above the upper surface of the element isolation region EI. The element isolation region EI includes a silicon oxide film, for example. The element isolation region EI has a shallow trench isolation (STI) structure.

In this application, a plate-like semiconductor layer as a pattern, which configures part of the semiconductor substrate SB in the memory cell region 1A, is referred to as fin FA, the pattern including an upper pattern that is exposed from the element isolation region EI and extends in the X direction, and a lower pattern extending from the upper pattern to the bottom of the trench D1 directly below the upper pattern. Similarly, a plate-like semiconductor layer as a pattern, which configures part of the semiconductor substrate SB in the peripheral region 1B, is referred to as fin FB, the pattern including an upper pattern that is exposed from the element isolation region EI and extends in the X direction, and a lower pattern extending from the upper pattern to the bottom of the trench D1 directly below the upper pattern.

That is, the fin is a semiconductor pattern protruding to above the semiconductor substrate from the upper surface of the semiconductor substrate corresponding to the bottom surface of each trench, and includes, for example, the protrusion extending in the X direction in FIG. 1. While not shown, a p-type well containing a p-type impurity (for example, boron (B)) is formed deeper than source-drain regions described later in the upper surface of each of the fins FA and FB.

As shown in FIGS. 1 and 2, the control gate electrode CG extending in the Y direction and the memory gate electrode MG extending in the Y direction are formed directly over the fins FA arranged in the Y direction so as to straddle the fins FA. The control gate electrode CG and the memory gate electrode MG each also extend directly over the element isolation region EI between the fins FA arranged in the Y direction. The upper surface of the control gate electrode CG is covered with an insulating film IF7 extending in the Y direction along the upper surface of the control gate electrode CG.

As shown in FIG. 2, the control gate electrode CG is formed over the fin FA with an insulating film G1 as a part of a gate insulating film. In one feature of the first embodiment, an insulating film IF6 as a part of the gate insulating film is formed between the upper surface of the fin FA and the insulating film G1. That is, the control gate electrode CG is formed over the upper surface of the fin FA with the insulating films IF6 and G1 in between, and formed over each side surface of the fin FA with the insulating film G1 in between. The control gate electrode CG formed over the side surface of the fin FA as mentioned herein means that the control gate electrode CG adjacent to the side surface of the fin FA is formed so as to cover the side surface, and does not mean that the control gate electrode CG is disposed directly over the side surface in a perpendicular direction.

The insulating film G1 covers the upper surface and the side surface of the fin FA exposed from the element isolation region EI, and includes a silicon oxide film, for example. The insulating film G1 has a thickness of 2 to 3 nm, for example. The insulating film IF6 includes a silicon oxide film, for example. The control gate electrode CG includes a polysilicon film, for example.

As shown in FIGS. 1 and 2, one side surface in the X direction of the control gate electrode CG is covered with a sidewall spacer SW, and the other side surface is covered with the memory gate electrode MG formed thereover with an oxide-nitride-oxide (ONO) film ON in between. That is, the memory gate electrode MG is adjacent to a side surface of a stacked pattern, which includes the insulating film G1, the control gate electrode CG, and an insulating film IF7, with the ONO film ON in between. The memory gate electrode MG is formed over the upper surface of the fin FA with the insulating film IF6 and the ONO film ON, which are formed in order on the upper surface of the fin FA, in between. That is, the ONO film ON covers the upper surface of the insulating film IF6, and has an L-shape section formed continuously along the upper surface of the insulating film IF6 and the side surface of the control gate electrode CG. The memory gate electrode MG covers the side surface of the fin FA with the ONO film ON in between.

The ONO film ON includes a stacked film in which a silicon oxide film X1, a silicon nitride film N1, and a silicon oxide film X2 are stacked in order from a semiconductor substrate SB side and from a control gate electrode CG side. The silicon nitride film N1 is a trapping insulating film (charge storage film, charge holding film). A charge storage state of the silicon nitride film N1 is allowed to be changed through operation of the memory cell MC, making it possible to change a threshold voltage of the memory cell MC. The ONO film ON has a thickness of about 20 nm, for example. The silicon oxide film X1 has a thickness of about 4 nm, for example. The silicon nitride film N1 has a thickness of about 10 nm, for example. The silicon oxide film X2 has a thickness of about 6 nm, for example. The numerical value of each thickness is merely exemplarily one, and is not limitative.

The memory gate electrode MG is isolated from the control gate electrode CG by the ONO film ON, and isolated from the fin FA by the insulating film IF6 and the ONO film ON. The memory gate electrode MG is formed over the upper surface of the fin FA with the insulating film IF6 and the ONO film ON in between, and over the side surface of the fin FA with the ONO film ON in between. That is, the insulating film IF6 is continuously formed over the upper surface of the fin FA from directly below the control gate electrode CG to directly below the memory gate electrode MG.

The insulating film IF6 covers the upper surface and an upper end of each side surface of the fin FA but exposes the side surface of the fin FA below that upper end directly below each of the control gate electrode CG and the memory gate electrode MG. That is, the side surface of the fin FA is not covered with the insulating film IF6 except for its upper end.

The side surface, which is not in contact with the ONO film ON, of the memory gate electrode MG in the X direction is covered with the sidewall spacer SW. The sidewall spacer SW includes, for example, a silicon nitride film, a silicon oxide film, or a stacked film of such films.

As shown in FIG. 1, a pair of patterns, each including the control gate electrode CG and the memory gate electrode MG adjacent to each other with the ONO film ON in between, are formed side by side in the X direction directly over the fins FA in the memory cell region 1A. The pair of patterns are separated from each other.

As shown in FIGS. 1 and 2, a pair of source-drain regions are formed in the upper surface of the fin FA laterally on both sides in the X direction of the pattern. Each of the source and drain regions is configured by two n-type semiconductor regions containing an n-type impurity (for example, phosphorus (P) or arsenic (As)) introduced therein, i.e., an extension region EX and a diffusion layer DF. The extension region EX has a lower concentration of the n-type impurity than the diffusion layer DF. The diffusion layer DF is formed deeper than the extension region EX. The extension region EX is disposed at a position closer to the upper surface of the fin FA directly below each of the control gate electrode CG and the memory gate electrode MG than the adjacent diffusion layer DF. As described above, the source-drain regions each have a lightly doped drain (LDD) structure including the extension region EX having a low impurity concentration and the diffusion layer DF having a high impurity concentration. While not shown, the source-drain regions are formed on each side surface in the Y direction of the fin FA.

The control gate electrode CG and the pair of source-drain regions formed in the upper surface of the fin FA on both sides of the control gate electrode CG configure a first transistor (control transistor) as a FINFET having a MISFET structure. The memory gate electrode MG and the pair of source-drain regions formed in the upper surface of the fin FA on both sides of the memory gate electrode MG configure a second transistor (memory transistor) as a FINFET having a MISFET structure. One memory cell MC of the first embodiment is configured by the first transistor and the second transistor sharing the source-drain regions. That is, the memory cell MC includes the control gate electrode CG, the memory gate electrode MG, the ONO film ON, a drain region near the control gate electrode CG, and a source region near the memory gate electrode MG.

As shown in FIG. 1, two memory cells MC are formed on one fin FA. The two memory cells MC share the source region. The upper surface and the side surface covered with each of the control gate electrode CG and the memory gate electrode MG include a channel region in which a channel is formed during operation of the memory cell MC. The memory cell MC is a nonvolatile memory element (nonvolatile memory) that is electrically rewritable and re-erasable. The memory cell MC of the first embodiment including the control gate electrode CG and the memory gate electrode MG adjacent to each other and the ONO film ON is referred to as split-gate metal oxide nitride oxide semiconductor (MONOS) memory.

As shown in FIG. 2, the gate electrode GE extending in the Y direction is formed directly over each fin FB in the peripheral region 1B so as to straddle the upside of the fin FB. The gate electrode GE is formed over the fin FB and the element isolation region EI with the insulating film G1 as a gate insulating film in between. Although the insulating film G1 in the memory cell region 1A and the insulating film G1 in the peripheral region 1B are in the same layer, they need not be integrally coupled to each other. The films in the same layer mentioned herein refer to a plurality of films formed by processing and separating one film formed in one manufacturing step. However, the insulating film G1 in the memory cell region 1A and the insulating film G1 in the peripheral region 1B may not be the films in the same layer, and may be films formed by different steps. The thickness of the gate insulating film between the control gate electrode CG and the upper surface of the fin FA is larger than the thickness of the gate insulating film between the gate electrode GE and the upper surface of the fin FB.

The gate electrode GE is formed over each side surface of the fin FB above the element isolation region EI with the insulating film G1 in between. The insulating film G1 covers the upper surface and the side surface of the fin FB exposed from the element isolation region EI, and covers the upper surface of the element isolation region EI. The insulating film G1 in the peripheral region 1B continuously covers the bottom surface of the gate electrode GE and the side surfaces on both sides of the gate electrode GE. The gate electrode GE includes, for example, a polysilicon film.

Each of the side surfaces on both sides in the X direction of the gate electrode GE is covered with the sidewall spacer SW. A pair of source-drain regions are formed in the upper surface of the fin FB laterally on both sides in the X direction of the gate electrode GE. As with the source-drain regions in the memory cell region 1A, each of the source and drain regions is configured by two n-type semiconductor regions containing an n-type impurity (for example, phosphorus (P) or arsenic (As)) introduced therein, i.e., an extension region EX and a diffusion layer DF. While not shown, the source-drain regions are also formed on each side surface of the fin FB in the Y direction.

The gate electrode GE and the pair of source-drain regions formed in the upper surface and the side surface of the fin FB on either side of the gate electrode GE configure a transistor Q1 as a low-withstand-voltage FINFET having a MISFET structure. Although one transistor Q1 formed on one fin FB is shown, a plurality of transistors Q1 may be formed on one fin FB. The upper surface and the side surfaces of the fin FB covered with the gate electrode GE include a channel region in which a channel is formed during operation of the transistor Q1.

Although this structure has been described with a case where the diffusion layer DF, which configures the source-drain regions in each of the memory cell region 1A and the peripheral region 1B, is formed in the surface of each fin, when an epitaxial layer is formed on the element isolation region EI while being in contact with the surface of the fin, such a diffusion layer DF may be formed in the epitaxial growth layer.

In this application, while each of the first transistor, the second transistor, and the transistor Q1 has part of the fin as a channel region and is formed in the upper part of the fin, such a transistor is referred to as FINFET. The first transistor and the second transistor configuring the memory cell MC are each driven by a higher voltage than the low-withstand-voltage transistor Q1 configuring a logic circuit, and thus requires higher withstand voltage performance than the transistor Q1.

A silicide layer S1 is formed in each of the upper surfaces of the memory gate electrode MG, the gate electrode GE, and the diffusion layer DF. The silicide layer S1 is made of, for example, nickel silicide (NiSi) or cobalt silicide (CoSi). The silicide layer S1 is provided to reduce a coupling resistance between an undepicted contact plug to be coupled to the upper surface of the memory gate electrode MG and each of the memory gate electrode MG, the gate electrode GE, and the diffusion layer DF. In an undepicted region, the silicide layer S1 is also formed in the upper surface of the control gate electrode CG exposed from the insulating film IF7.

The element isolation region EI, the fins FA and FB, the control gate electrode CG, the memory gate electrode MG, the insulating film IF7, the gate electrode GE, and the sidewall spacer SW are each covered with the interlayer insulating film IL. The interlayer insulating film IL mainly includes a silicon oxide film, for example. While not shown, a thin insulating film (liner film) is formed between the element isolation region EI, the fin FA, the fin FB, the control gate electrode CG, the memory gate electrode MG, the insulating film IF7, the gate electrode GE, and the sidewall spacer SW. The insulating film includes, for example, a silicon nitride film. The upper surface of the interlayer insulating film IL is planarized over the insulating film IF7.

A plurality of contact plugs (conductive coupling parts) PG are formed so as to penetrate the interlayer insulating film IL, and are each electrically coupled to the gate electrode GE, the control gate electrode CG, the memory gate electrode MG, the source region, or the drain region via the silicide layer S1. An undepicted interconnection layer including an interconnection is formed on the contact plug PG. The upper surface of the contact plug PG is coupled to that interconnection. The contact plug PG is mainly made of tungsten (W), for example.

The semiconductor device of the first embodiment is mainly characterized in that the insulating film IF6 is formed on the upper surface of the fin FA below the control gate electrode CG and below the memory gate electrode MG, and a portion near an end of the upper surface of the fin FA (a corner of the fin FA) is round due to formation of the insulating film IF6. This is described below with reference to FIG. 3. A boundary portion between the upper surface and the side surface of the fin is referred to as fin corner. FIG. 3 does not show a structure (including, for example, the control gate electrode) over the fin FA except for the insulating films G1 and IF6.

As shown in FIG. 3, the upper surface of the fin FA is covered with the insulating film IF6. The insulating film IF6 also covers the side surfaces of the upper end of the fin FA. That is, thickness of the insulating film IF6 in a direction (height direction, perpendicular direction, longitudinal direction) perpendicular to the main surface of the semiconductor substrate SB is larger in the end portion in the Y direction of the insulating film IF6 than in the central portion in the Y direction of the insulating film IF6. However, the upper surface of the insulating film IF6 is generally flat, or lower at the end portion in the Y direction than at the central portion in the Y direction. Specifically, although the thickness L2 of the end portion in the Y direction of the insulating film IF6 is larger than the thickness L1 of the central portion in the Y direction of the insulating film IF6, this does not mean that the upper surface of the end portion of the insulating film IF6 protrudes above the upper surface of the central portion of the insulating film IF6.

The thickness L1 of the central portion of the insulating film IF6 is, for example, 5 to 10 nm, and the thickness L2 of the end portion thereof is, for example, 6 to 12 nm. That is, the thickness L2 is about 20% larger than the thickness L1. The thickness L1 of the central portion of the insulating film IF6 refers to a thickness in a perpendicular direction of the insulating film IF6 covering the uppermost surface of the fin FA.

The insulating film IF6 is formed by oxidizing the upper surface of the fin FA, and is configured by an oxide film formed by oxidation of part of the side surface of the fin FA near an end portion of that upper surface in such an oxidation step. Consequently, each end portion of the insulating film IF6 extends downward. Specifically, while a portion extending (protruding) downward exists in the end portion of the insulating film IF6 in a direction (lateral direction, horizontal direction) along the upper surface of the semiconductor substrate SB, such a portion is a bird's beak formed in the oxidation step. The lateral width of the bird's beak is gradually reduced as approaching the upper surface of the element isolation region EI. In other words, the lateral width of a portion extending downward of the end portion of the insulating film IF6 is gradually reduced downward. Formation of such a bird's beak allows the corner of the fin FA to be round compared with the case where the insulating film IF6 is not formed. In other words, the corner of the fin FA has a large curvature radius due to formation of the insulating film IF6. That is, the corner of the fin FA is chamfered.

As shown in FIG. 2, the insulating film IF6 is not formed on the fin FB in the peripheral region 1B, the corner of the fin FB is angulate compared with the corner of the fin FA. In other words, the corner of the fin FA is round and has a large curvature radius compared with the corner of the fin FB. Since the upper surface of the fin FA is oxidized to form the insulating film IF6, height of the uppermost surface of the fin FA is lower than height of the uppermost surface of the fin FB. The height of the uppermost surface of the fin FA is lower than the height of the uppermost surface of the fin FB regardless of whether the fin FA is in a region where the fin FA is covered with the control gate electrode CG or the memory gate electrode MG. That is, the height of the uppermost surface of the fin FA in a region exposed from the insulating film IF6 is also lower than the height of the uppermost surface of the fin FB. This is because the insulating film IF6, which is formed by the oxidation step on the fin FA in the region uncovered with the control gate electrode CG and the memory gate electrode MG, is removed in a manufacturing process of the semiconductor device.

The gate insulating film directly below the control gate electrode CG configuring the control transistor is configured by a stacked film of the insulating films IF6 and G1 on the upper surface of the fin FA. The stacked film has a thickness of, for example, 7 to 13 nm directly over the central portion in the Y direction of the upper surface of the fin FA. The gate insulating film directly below the memory gate electrode MG configuring the memory transistor is configured by a stacked film of the insulating film IF6 and the ONO film ON on the upper surface of the fin FA. The stacked film has a thickness of, for example, 25 to 30 nm directly over the central portion in the Y direction of the upper surface of the fin FA. The upper limit of the thickness of the central portion of the insulating film IF6 is about 10 nm to avoid a state where the thickness of each stacked film excessively increases so that an electric field of each of the control gate electrode CG and the memory gate electrode MG does not affect the channel. Consequently, on and off of the control transistor and on and off of the memory transistor can be switched by applying a voltage to the control gate electrode CG and the memory gate electrode MG, respectively.

If the thickness in the central portion of the insulating film IF6 is made larger than 10 nm, the upper surface of the fin FA is excessively oxidized, leading to a decrease in height of the fin FA. For example, when the insulating film IF6 is formed so as to have a thickness of the central portion of 10 nm, the height of the fin FA is lowered about 3 nm. Since the original height of the fin FA is about 40 nm, the upper limit of the thickness of the central portion of the insulating film IF6 is desirably about 10 nm to limit the decreased amount of the height of the fin FA to 10% or less.

The lower limit of the thickness of the insulating film IF6 is desirably about 5 nm. If the insulating film IF6 has a thickness of 5 nm or more, it is possible to reduce a probability of gate induced drain leakage (GIDL) as a cause of erroneous write to about half, and thus prevent the erroneous write. In the first embodiment, therefore, the thickness in the central portion of the insulating film IF6 is about 5 to 10 nm. The GIDL is described in detail later.

On the other hand, the gate insulating film G1, which is located directly below the control gate electrode CG configuring the control transistor and covers the side surfaces of the fin FA, has a thickness of about 2 to 3 nm. That is, the gate insulating film, including the insulating films IF6 and G1 covering the upper surface of the fin FA, of the control transistor has a larger thickness than the gate insulating film including the insulating film G1 covering the side surfaces of the fin FA. Similarly, the gate insulating film, including the insulating film IF6 and the ONO film ON covering the upper surface of the fin FA, of the memory transistor has a larger thickness than the gate insulating film including the ONO film ON covering the side surfaces of the fin FA. In other words, the thickness of the gate insulating film of each of the control transistor and the memory transistor is larger in a portion covering the upper surface of the fin FA than in a portion covering the side surfaces of the fin FA.

Operation of Semiconductor Device

Operation of a nonvolatile memory in the semiconductor device of the first embodiment is now mainly described with reference to FIG. 32. FIG. 32 is a table explaining operation voltages of a split-gate memory cell.

The memory cell of the first embodiment has a MISFET structure, and uses a charge storage state of the trapping insulating film in the gate electrode of the MISFET as memory information, and reads the charge storage state as a threshold of a transistor. The trapping insulating film refers to a charge-storable insulating film, and includes, for example, a silicon nitride film. Electric charges are injected or emitted into/from such a charge storage region to shift the threshold voltage of the MISFET, and thus the MISFET is allowed to operate as a memory element. A nonvolatile semiconductor memory device using the trapping insulating film includes a split-gate MONOS memory such as the memory cell of the first embodiment.

FIG. 32 is the table showing an example of a condition of voltage application to each part of a selected memory cell in "write", "erase", and "read". The table of FIG. 32 shows a voltage Vmg applied to the memory gate electrode MG, a voltage Vs applied to the source region, a voltage Vcg applied to the control gate electrode CG, and a voltage Vd applied to the drain region of the memory cell MC as shown in FIG. 2, and shows a base voltage Vb applied to an undepicted p-type well in the upper surface (surface of the fin FA) of the semiconductor substrate SB in each of "write", "erase", and "read". The selected memory cell mentioned herein refers to a memory cell selected as an object for "write", "erase", or "read".

In the example of the nonvolatile memory shown in FIG. 2, a semiconductor region on a memory gate electrode MG side is the source region, and a semiconductor region on a control gate electrode CG side is the drain region. The condition shown in the table of FIG. 32 is a preferred example of the voltage application condition and is not limitative, and can be variously modified or altered as necessary. In the first embodiment, injection of electrons and injection of holes into the silicon nitride film N1, which is a charge storage part of the ONO film ON of the memory transistor, are defined as "write" and "erase", respectively.

This operation is described with a case where a write method is an SSI method, and an erase method is a BTBT method. The SSI method is considered as an operation method in which the memory cell is written by injecting hot electrons into the silicon nitride film N1 (see FIG. 2). The BTBT method is considered as an operation method in which the memory cell is erased by injecting hot holes into the silicon nitride film N1. These are specifically described below.

The write method herein uses a write method (hot-electron injection write method), in which write is performed by hot-electron injection through source side injection, what is called, a source side injection (SSI) method. In the case of the SSI method, for example, a voltage (Vmg=10 V, Vs=5 V, Vcg=1 V, Vd=0.5 V, Vb=0 V) shown in "write operation voltage" in the table of FIG. 32 is applied to each part of a selected memory cell to be written, thereby electrons are injected into the silicon nitride film N1 in the ONO film ON of the selected memory cell so that write is performed.

At this time, hot electrons are generated in the channel region (between the source and the drain) below between the two gate electrodes (the memory gate electrode MG and the control gate electrode CG), and the hot electrons are injected into the silicon nitride film N1 as a charge storage part in the ONO film ON below the memory gate electrode MG. The injected hot electrons (electrons) are captured by trap levels in the silicon nitride film N1 configuring the ONO film ON, resulting in an increase in threshold voltage of the memory transistor. That is, the memory transistor enters a write state.

In write operation, a voltage applied to each part of one of unselected memory cells, which is adjacent to a selected memory cell and coupled to the same word line as the selected memory cell, is equal to a voltage applied to that of the selected memory cell except that a voltage Vd applied to the drain region is 1.5 V. Specifically, in write operation, a voltage condition applied to an unselected cell, in which the same voltage as that for a selected cell is applied to the control gate electrode CG, includes Vmg of 10 V, Vs of 5 V, Vcg of 1 V, Vd of 1.5 V, and Vb of 0 V. That is, the Vdd voltage is applied to a drain region of the unselected cell.

An erase method (hot-hole injection erase method), in which erase is performed by hot-hole injection through band-to-band tunneling (BTBT), what is called, a BTBT method is used herein. In the case of the BTBT method, holes generated by the BTBT are injected into the charge storage part (the silicon nitride film N1 in the ONO film ON), so that erase is performed. For example, a voltage (Vmg=−6 V, Vs=6 V, Vcg=0 V, Vd=open, Vb=0 V) shown in "erase operation voltage" in the column A of the table of FIG. 32 is applied to each part of a selected memory cell to be erased. Consequently, holes are generated by the BTBT phenomenon and accelerated by an electric field, thereby the holes are injected into the silicon nitride film N1 configuring the ONO film ON of the selected memory cell, so that the threshold voltage of the memory transistor is reduced. That is, the memory transistor enters an erase state.

For read, for example, a voltage (Vmg=0 V, Vs=0 V, Vcg=1.5 V, Vd=1.5 V, Vb=0 V) shown in "read operation voltage" in FIG. 32 is applied to each part of the selected memory cell to be read. The voltage Vmg applied to the memory gate electrode MG for read is set to an intermediate value between the threshold voltage in the write state and the threshold voltage in the erase state of the memory transistor, making it possible to distinguish between the write state and the erase state.

Method of Manufacturing Semiconductor Device

A method of manufacturing the semiconductor device of the first embodiment is described with reference to FIGS. 4 to 20. FIGS. 4 to 20 are each a sectional view to explain the method of manufacturing the semiconductor device of the first embodiment. FIGS. 4 to 20 each sequentially show a section of the memory cell region 1A, a section of the peripheral region (logic region) 1B, a section along the line A-A (see FIG. 2), a section along the line B-B (see FIG. 2), and a section along the line C-C (see FIG. 2) in this order from the left. Such sections correspond to those of FIG. 2.

That is, while the five sections are arranged in each of FIGS. 4 to 20, the first section from the left is a section of the memory cell region 1A along a longitudinal direction of the fin formed in a manufacturing process. The second section from the left is a section of the peripheral region 1B along the longitudinal direction of the fin formed in the manufacturing process. The third to fifth sections from the left are each along a short direction of the fin. In the five sections arranged in each of FIGS. 4 to 20, the third section from the left is a section including a region, in which the control gate electrode is formed, in the memory cell region 1A. The fourth section from the left is a section including a region, in which the memory gate electrode is formed, in the memory cell region 1A. The fifth section from the left is a section including a region, in which the gate electrode is formed, in the peripheral region 1B.

Figure 4:
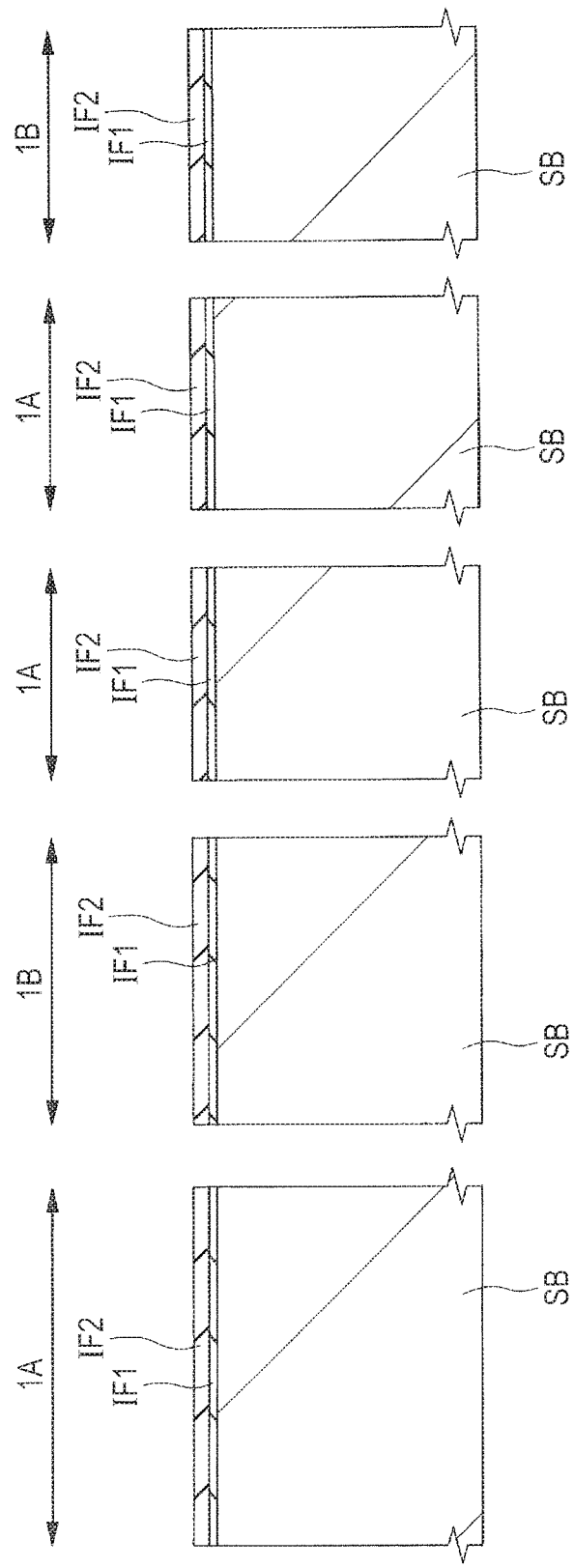
FIG. 4 includes sectional views explaining a manufacturing process of the semiconductor device of the first embodiment.

First, as shown in FIG. 4, a p-type semiconductor substrate SB is provided, and an insulating film IF1 including a thin silicon oxide film is formed in the upper surface of the semiconductor substrate SB by a thermal oxidation process or the like. The insulating film IF1 has a thickness of 10 nm, for example. Subsequently, an insulating film IF2 is formed on the insulating film IF1 using a chemical vapor deposition (CVD) process, for example. The insulating film IF2 includes, for example, a silicon nitride film. The insulating film IF2 has a thickness of 100 nm, for example.

Figure 5:
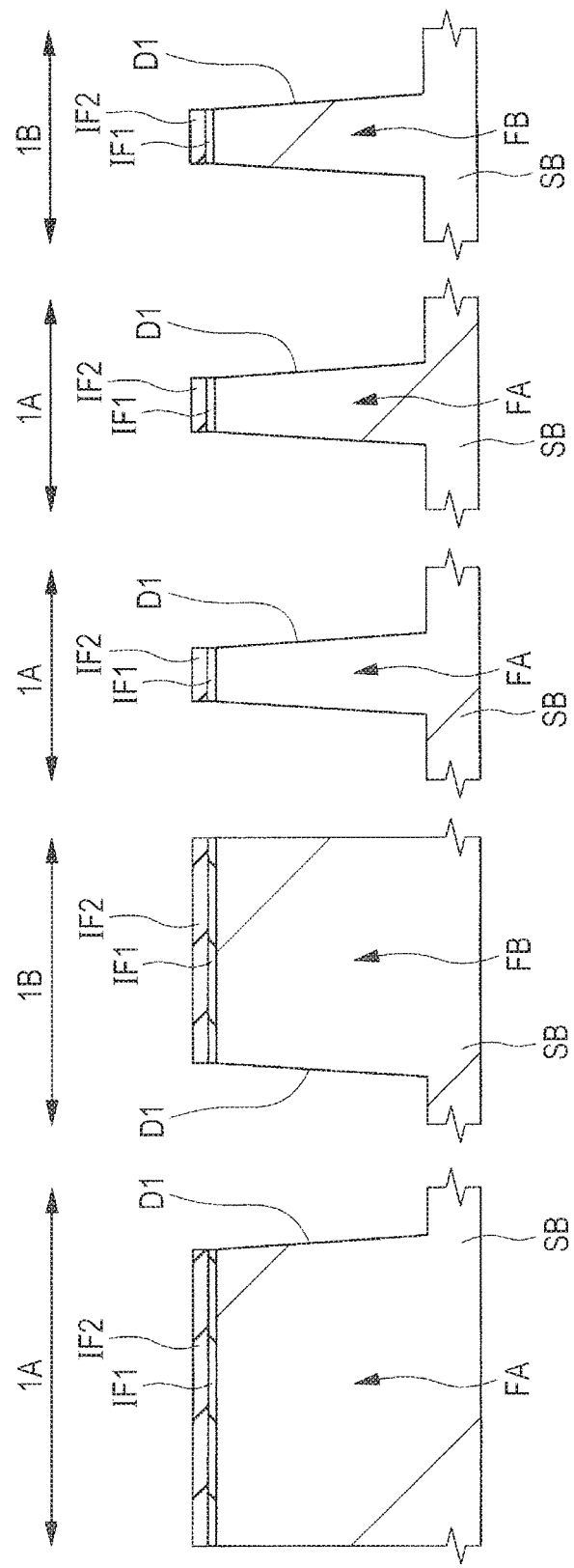
FIG. 5 includes sectional views explaining the manufacturing process of the semiconductor device following FIG. 4.

Subsequently, as shown in FIG. 5, a photolithography technique and a dry etching process are used to etch the insulating films IF2 and IF1 and the semiconductor substrate SB, thereby the insulating films IF2 and IF1 and the upper surface of the semiconductor substrate SB are partially processed. As a result, the fins FA and FB are each formed of a portion, including the upper surface, of the semiconductor substrate SB, and the trench D1 is formed around each of the fins FA and FB.

That is, the plate-like fins FA and FB are formed so as to protrude upward on the upper surface of the semiconductor substrate SB. The plate-like pattern as part of the upper surface of the semiconductor substrate SB in the memory cell region 1A configures the fin FA extending in the X direction, and the plate-like pattern as part of the upper surface of the semiconductor substrate SB in the peripheral region 1B configures the fin FB extending in the X direction. The trench D1 is formed in the upper surface of the semiconductor substrate SB. Height from the bottom surface of the trench D1 (the upper surface of the semiconductor substrate SB) to the upper surface of the insulating film IF2 is 400 nm, for example.

Figure 6:
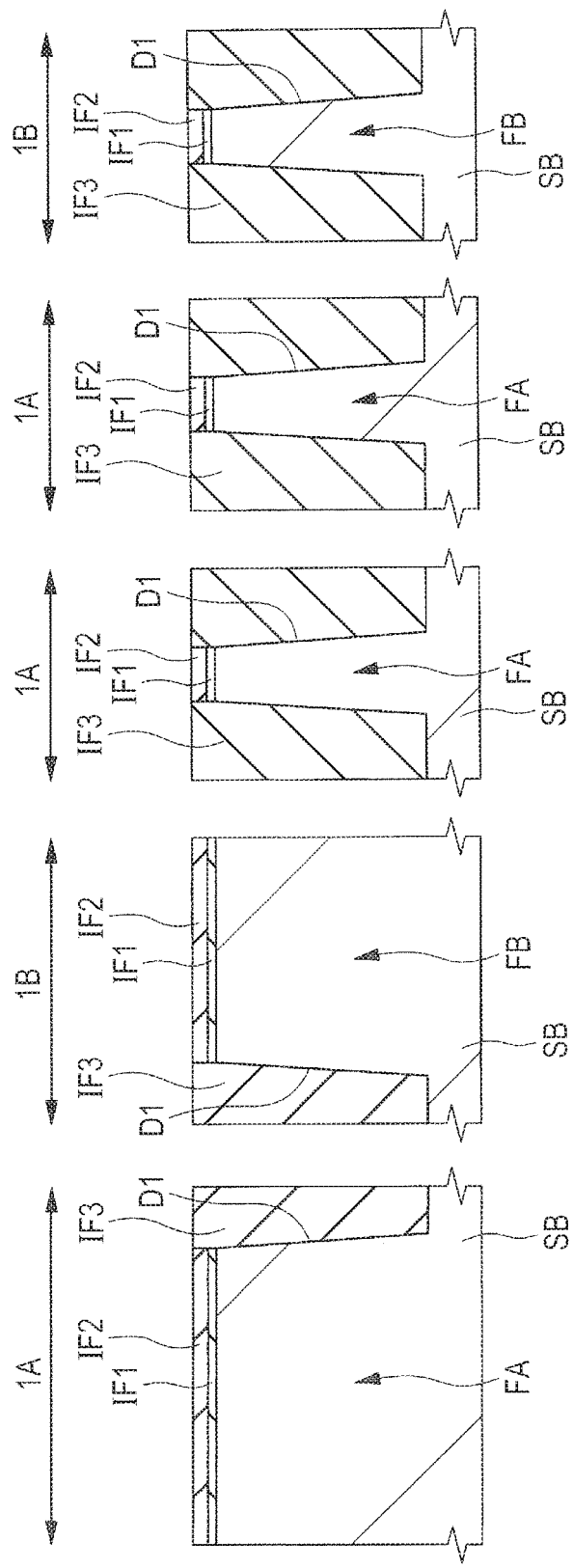
FIG. 6 includes sectional views explaining the manufacturing process of the semiconductor device following FIG. 5.

Subsequently, as shown in FIG. 6, inside of the trench D1 is filled with an insulating film IF3 using a CVD process, for example. That insulating film IF3 includes, for example, a silicon oxide film, and has a thickness of 1000 μm, for example. Subsequently, the insulating film IF3 is polished using a chemical mechanical polishing (CMP) process, for example. As a result, the upper surface of the insulating film IF2 is exposed, and the upper surface of the insulating film IF2 and the upper surface of the insulating film IF3, which is completely buried in the trench D1, are planarized.

Figure 7:
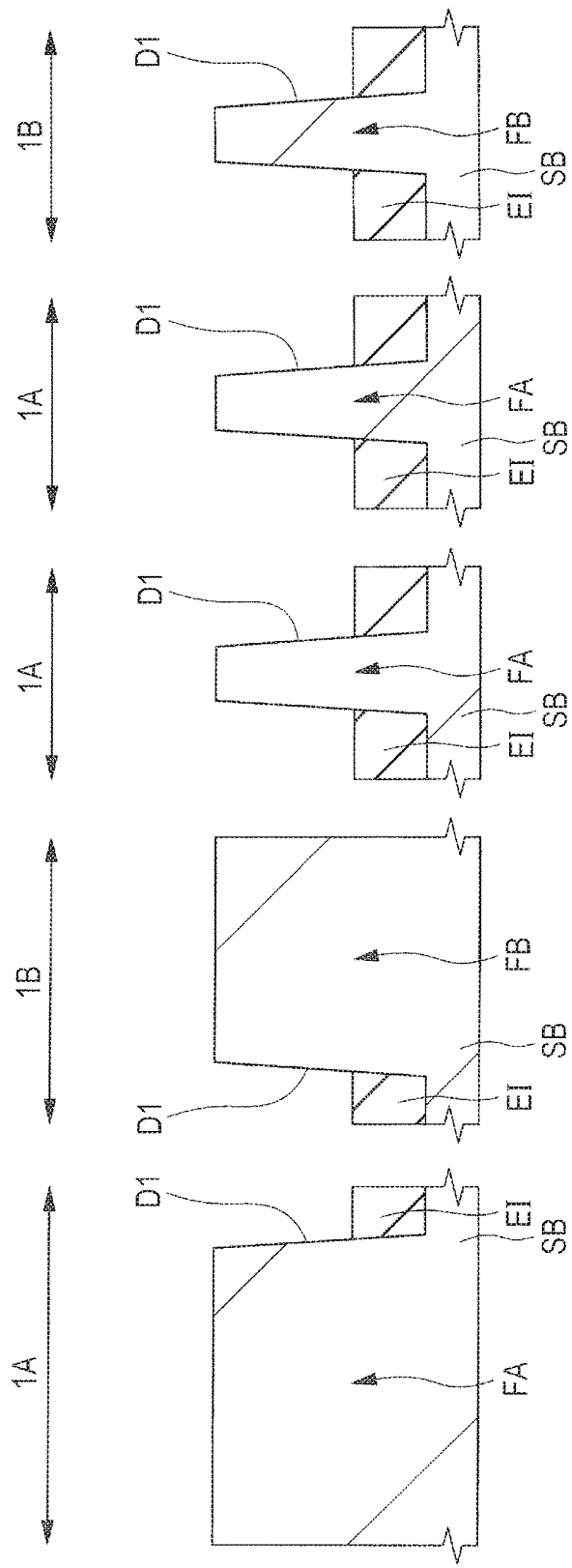
FIG. 7 includes sectional views explaining the manufacturing process of the semiconductor device following FIG. 6.

Subsequently, as shown in FIG. 7, the upper surface of the insulating film IF3 is etched back to retract the upper surface of the insulating film IF3 to a position about 50 nm below the upper surface of each of the fins FA and FB. As a result, a part of each of the side surfaces of the fins FA and FB are exposed. The insulating film IF3, which covers the bottom surface of the trench D1 and a part of each of the side surfaces of the fins FA and FB, configures the element isolation region EI. Subsequently, the insulating films IF2 and IF1 are removed using an etching process. Consequently, the respective upper surfaces of the fins FA and FB are exposed.

Figure 8:
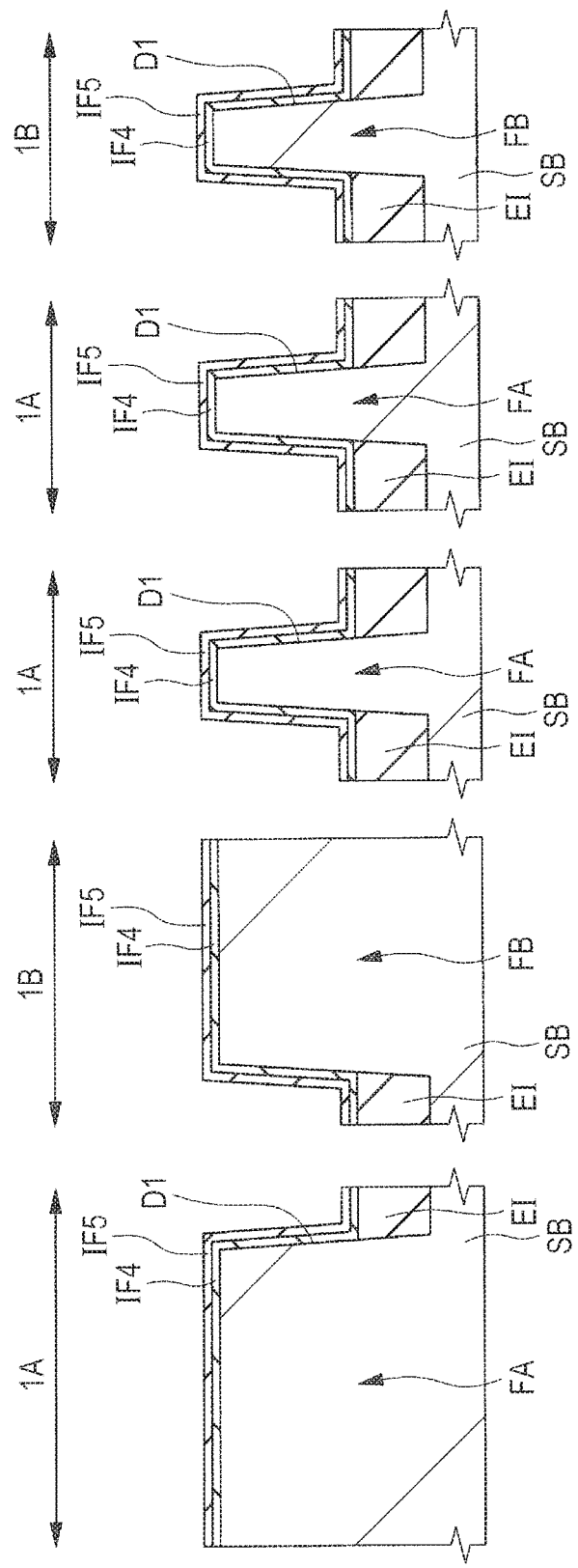
FIG. 8 includes sectional views explaining the manufacturing process of the semiconductor device following FIG. 7.

Subsequently, as shown in FIG. 8, insulating films IF4 and IF5 are formed in order over the semiconductor substrate SB using a CVD process, for example. The insulating films IF4 and IF5 cover the upper surface of the element isolation region EI and the surface of each of the fins FA and FB exposed from the element isolation region EI. The insulating film IF4 includes, for example, a silicon oxide film, and has a thickness of about 5 nm, for example. The insulating film IF5 includes, for example, a silicon nitride film, and has a thickness of about 5 nm, for example.

Figure 9:
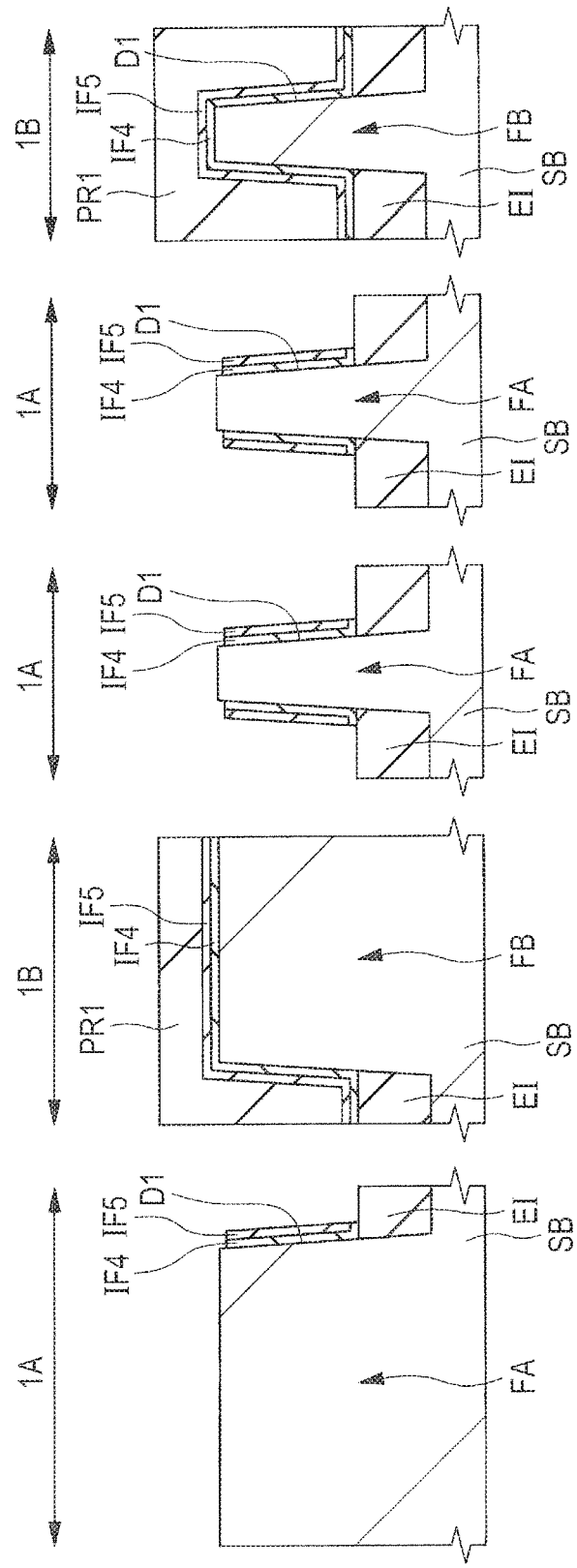
FIG. 9 includes sectional views explaining the manufacturing process of the semiconductor device following FIG. 8.

Subsequently, as shown in FIG. 9, a photoresist film PR1 is formed so as to cover the main surface of the semiconductor substrate SB in the peripheral region 1B, and then dry etching is performed using the photoresist film PR1 as a mask to remove the insulating film IF4 covering the upper surface of the fin FA and the insulating films IF4 and IF5 covering the upper surface of the element isolation region EI. As a result, the respective upper surfaces of the fin FA and the element isolation region EI in the memory cell region 1A are exposed. The side surfaces of the fin FA and the upper surface and the side surfaces of the fin FB are covered with a stacked film including the insulating films IF4 and IF5.

Figure 10:
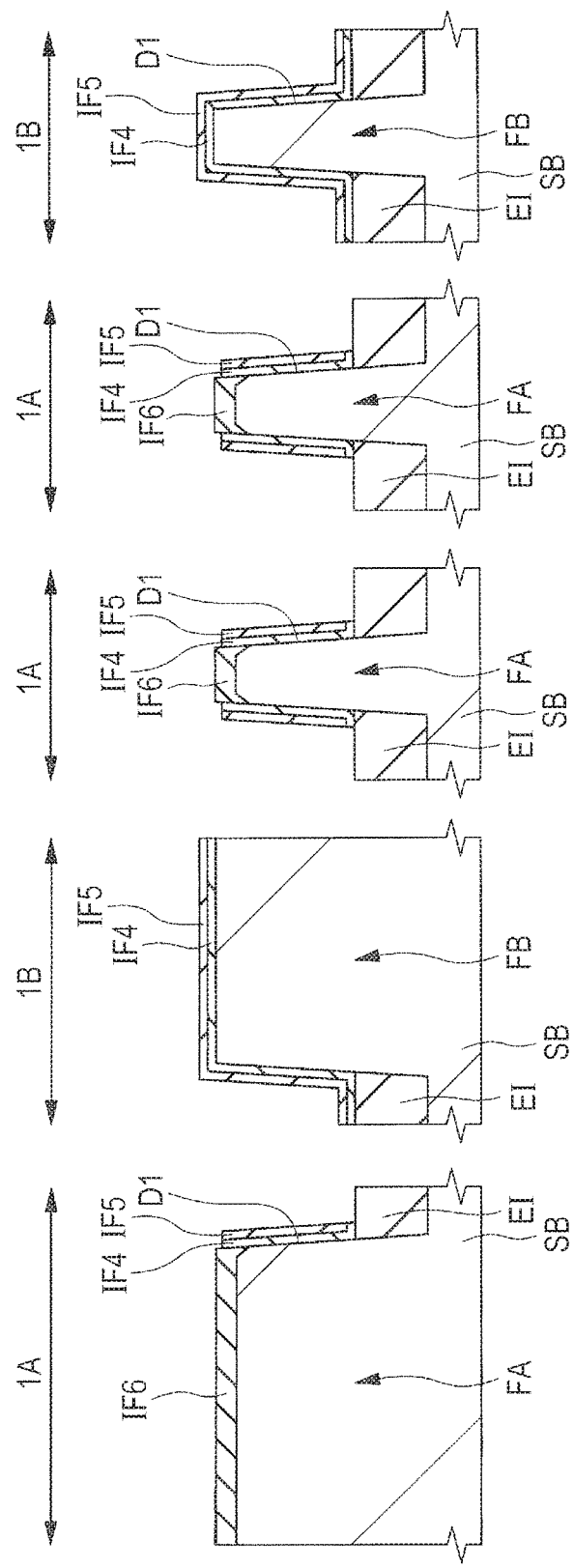
FIG. 10 includes sectional views explaining the manufacturing process of the semiconductor device following FIG. 9.

Subsequently, as shown in FIG. 10, the photoresist film PR1 is removed, and then the upper surface of the fin FA exposed from the insulating films IF4 and IF5 and the element isolation region EI is oxidized by a dry oxidation process (thermal oxidation process). Such dry oxidation is performed by applying a heat of 900 to 1000° C. to the semiconductor substrate SB in an oxygen gas atmosphere. Consequently, an insulating film IF6 including a silicon oxide film is formed on the upper surface of the fin FA. In this oxidation step, the dry oxidation process is used rather than a wet oxidation process to prevent oxidation of the fins FA and FB in regions covered with the insulating film IF5 including the silicon nitride film.

When the oxidation step is performed by an in-situ steam generation (ISSG) oxidation process, the upper surface of the fin FA is oxidized by applying heat of 900 to 1100° C. to the semiconductor substrate SB in an atmosphere containing hydrogen gas and oxygen gas.

In the oxidation step, the element isolation region EI and the side surfaces of the fin FA, which are covered with the stacked film including the insulating films IF4 and IF5, are basically not oxidized. Hence, the insulating film IF6 is not formed over side surface portions of the fin FA covered with the element isolation region EI and over most of the side surfaces of the fin FA covered with the stacked film including the insulating films IF4 and IF5.

In each end portion (corner) of the upper surface of the fin FA, however, since oxygen is supplied onto the surface of the fin FA not only from above but also in an oblique direction, oxidation increases compared with in the central portion of the upper surface of the fin FA. That is, a bird's beak extending downward is formed in the corner of the fin FA. The bird's beak corresponds to a portion having a large thickness formed in each lateral end portion of the insulating film IF6, and is formed by oxidizing the upper end of the side surface of the fin FA covered with the stacked film including the insulating films IF4 and IF5.

The thickness in the perpendicular direction of the lateral end portion (bird's beak) of the insulating film IF6 is larger than thickness in the perpendicular direction of the laterally central portion of the insulating film IF6. A lateral width of the bird's beak is gradually reduced as approaching the upper surface of the element isolation region EI. In other words, the lateral width of a portion extending downward of the end portion of the insulating film IF6 is gradually reduced downward. Formation of such a bird's beak allows the corner of the fin FA to be round compared with the case where the insulating film IF6 is not formed. In other words, the corner of the fin FA has a large curvature radius due to formation of the insulating film IF6.

Figure 11:
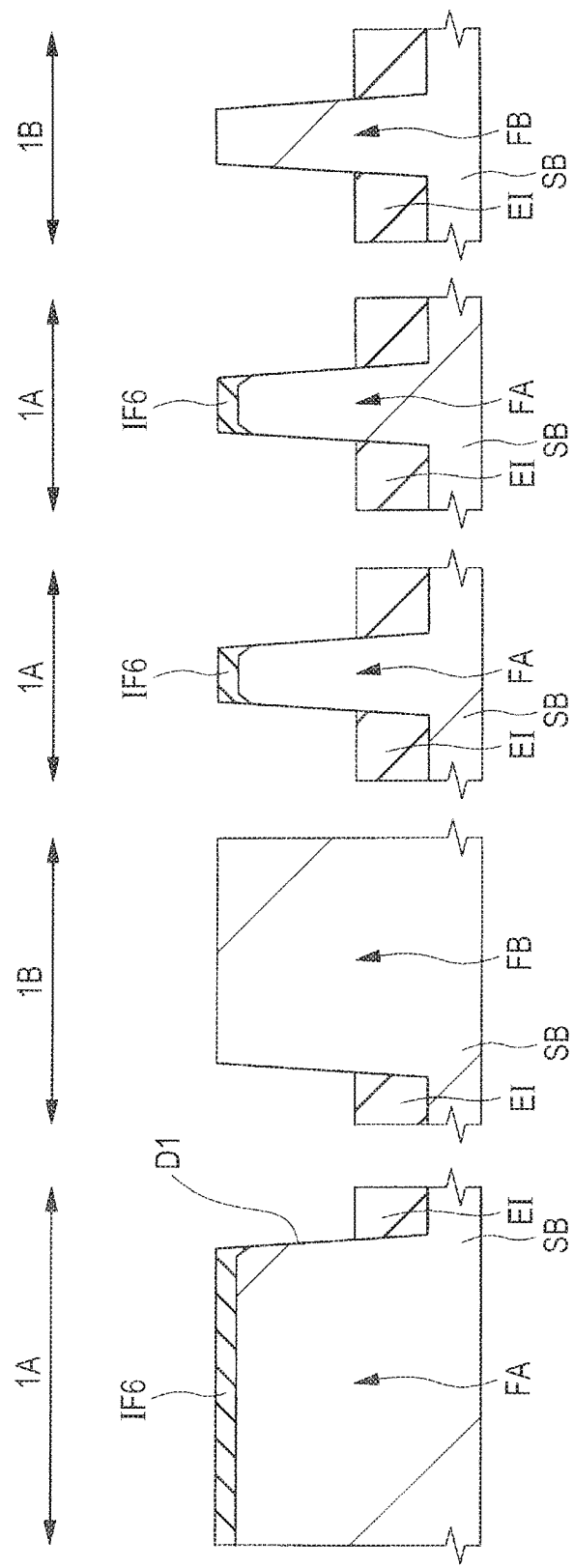
FIG. 11 includes sectional views explaining the manufacturing process of the semiconductor device following FIG. 10.

Subsequently, as shown in FIG. 11, the insulating films IF5 and IF4 are removed by, for example, a wet etching process to expose the side surfaces of the fin FA, the upper surface and the side surfaces of the fin FB, and the upper surface of the element isolation region EI in the peripheral region 1B. When the insulating film IF4 including the silicon oxide film is removed, the insulating film IF6 including the silicon oxide film is substantially not removed. This is because while the insulating film IF4 formed by the deposition process (for example, CVD process) is likely to be removed because of its low density, the insulating film IF6 formed by the oxidation process is less likely to be removed because of its high density.

When the insulating film IF4 covering the side surfaces of the fin FA and the surface of the fin FB is not formed, and when the insulating film IF5 is in contact with each of the fins FA and FB, the surfaces of the fins FA and FB are disadvantageously roughened during removal of the insulating film IF5. Since the insulating film IF4 is formed under the insulating film IF5, occurrence of such a problem is prevented.

Figure 12:
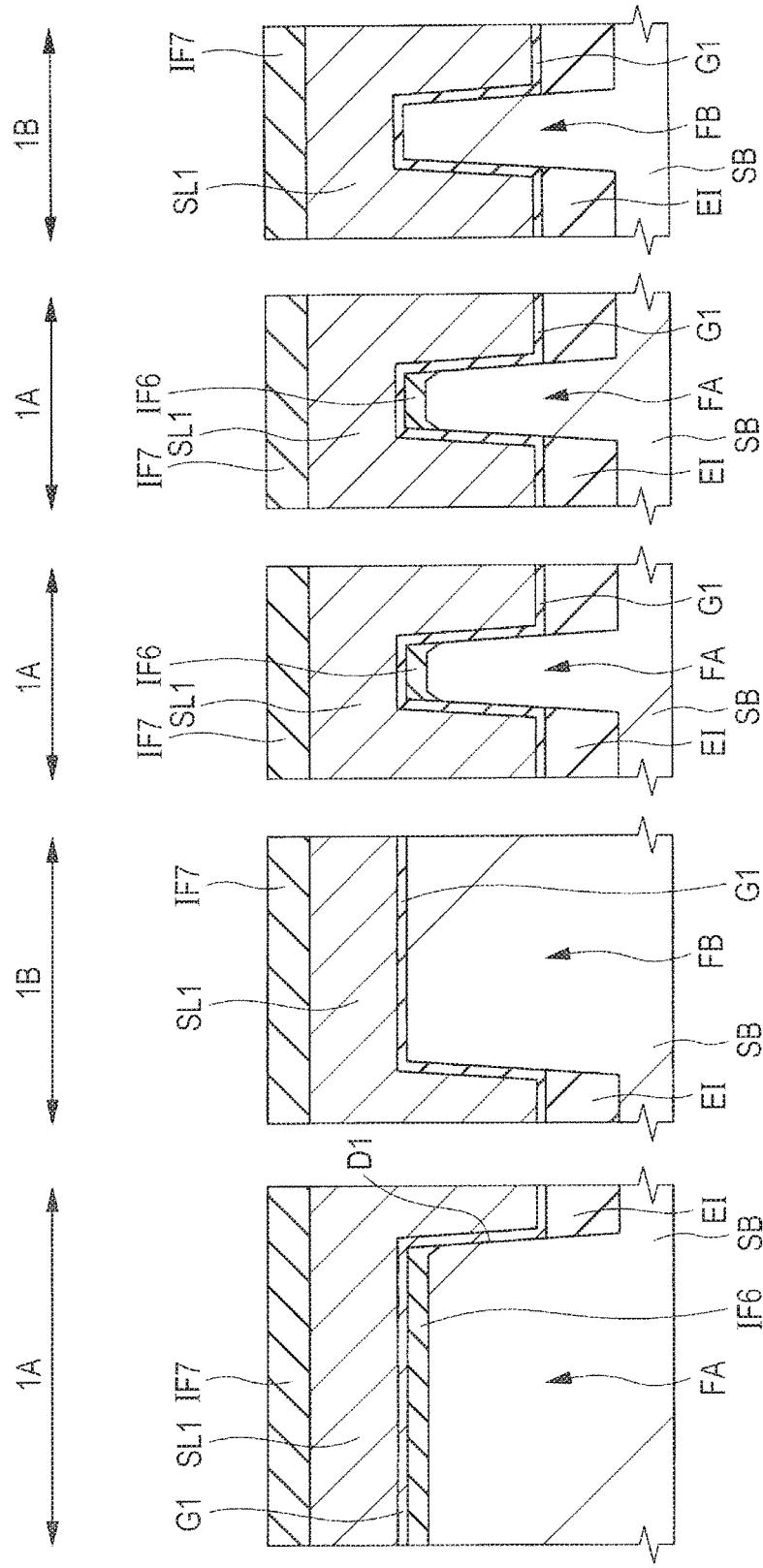
FIG. 12 includes sectional views explaining the manufacturing process of the semiconductor device following FIG. 11.

Subsequently, as shown in FIG. 12, the insulating film G1 including, for example, a silicon oxide film is formed over the semiconductor substrate SB using a thermal oxidation process, for example. The insulating film G1 covers the side surfaces and the upper surfaces of the respective fins FA and FB, and acts as a gate insulating film of the control transistor in the memory cell region 1A and a gate insulating film of the transistor in the peripheral region 1B. The insulating film G1 has a thickness of about 2 to 3 nm, for example. Although this process is described with a case where the insulating film G1 is also formed on the insulating film IF6 and on the element isolation region EI, the insulating film G1 formed on the insulating film IF6 including the silicon oxide film and the insulating film G1 formed on the element isolation region EI may be considered to be integrated with the insulating film IF6 and the element isolation region EI, respectively.

Subsequently, as shown in FIG. 12, a polysilicon film (conductor film) SL1 is formed using, for example, a CVD process on each of the element isolation region EI, the fins FA and FB, and the insulating films IF6 and G1, and then the upper surface of the polysilicon film SL1 is polished by a CMP process or the like. Subsequently, while not shown, the upper surface of the polysilicon film SL1 is thermally oxidized to form a silicon oxide film covering the upper surface. Subsequently, an insulating film IF7 is formed on the polysilicon film SL1 using, for example, a CVD process. The insulating film IF7 includes, for example, a silicon nitride film. The polysilicon film SL1 has a thickness of 100 nm, for example. The insulating film IF7 has a thickness of 80 nm, for example. The numerical value of each thickness is merely exemplarily one, and is not limitative.

Figure 13:
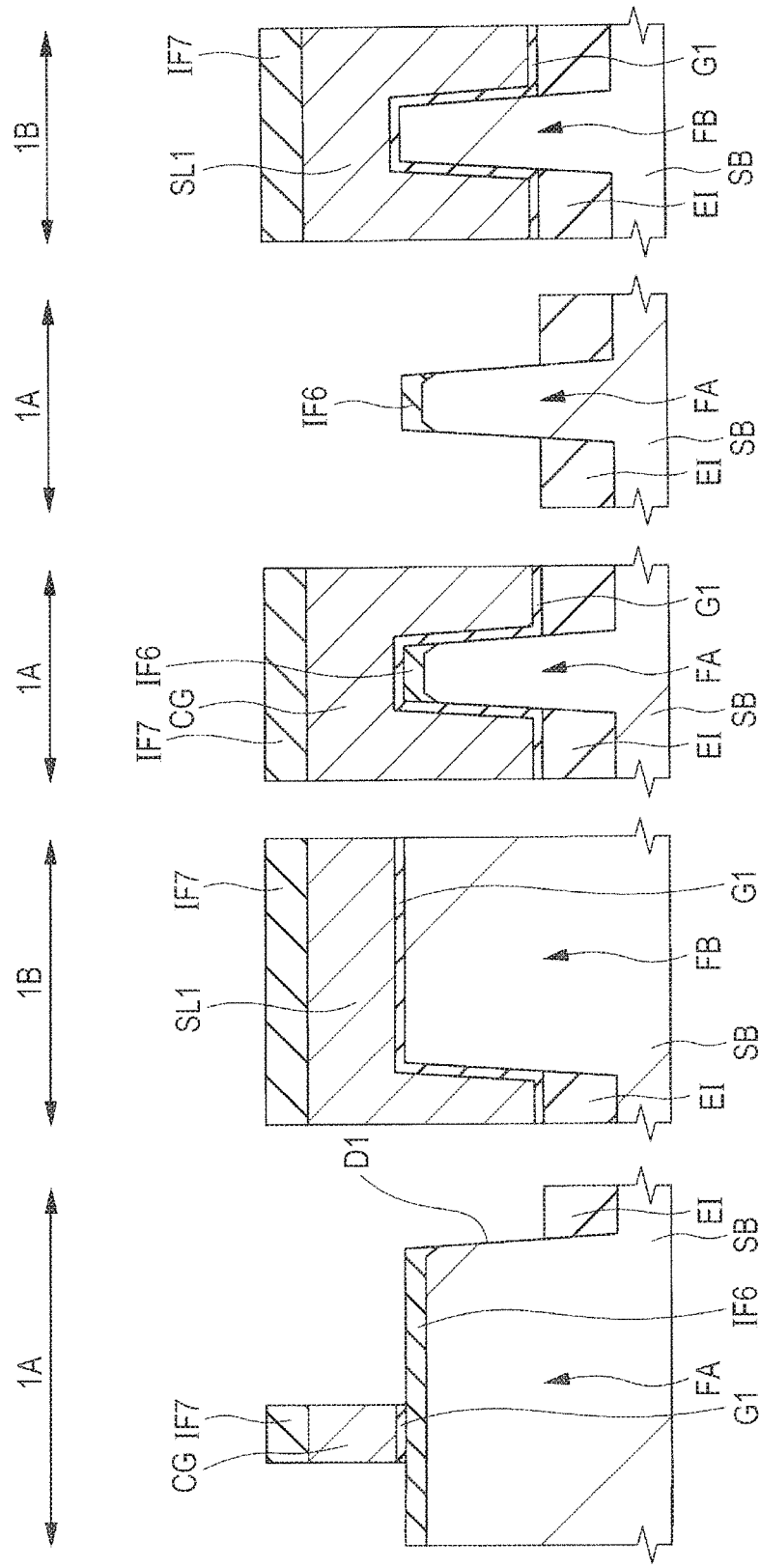
FIG. 13 includes sectional views explaining the manufacturing process of the semiconductor device following FIG. 12.

Subsequently, as shown in FIG. 13, a photolithography technique and a dry etching process are used to process the insulating film IF7, the polysilicon film SL1, and the insulating film G1 in the memory cell region 1A. Specifically, such films are patterned while the peripheral region 1B is covered with an undepicted photoresist film. The photoresist film is removed after that patterning. Consequently, a stacked pattern including the insulating film IF7, the polysilicon film SL1, and the insulating film G1 is formed directly over the fin FA. The control gate electrode CG including the polysilicon film SL1 is formed through such patterning.

The stacked pattern including the insulating film IF7, the control gate electrode CG, and the insulating film G1 extends in the Y direction, and is disposed so as to straddle the fins FA. In a region of the memory cell region 1A other than the portion having that stacked pattern, the insulating film IF7, the polysilicon film SL1, and the insulating film G1 in the memory cell region 1A are removed by the etching, thereby the side surfaces of the fin FA, the upper surface of the insulating film IF6, and the upper surface of the element isolation region EI are exposed. Subsequently, the main surface of the semiconductor substrate SB is subjected to a cleaning step to remove the residue formed in the etching step. In this step, the upper surface of the insulating film IF6 exposed from the control gate electrode CG is subjected to a cleaning liquid.

Figure 14:
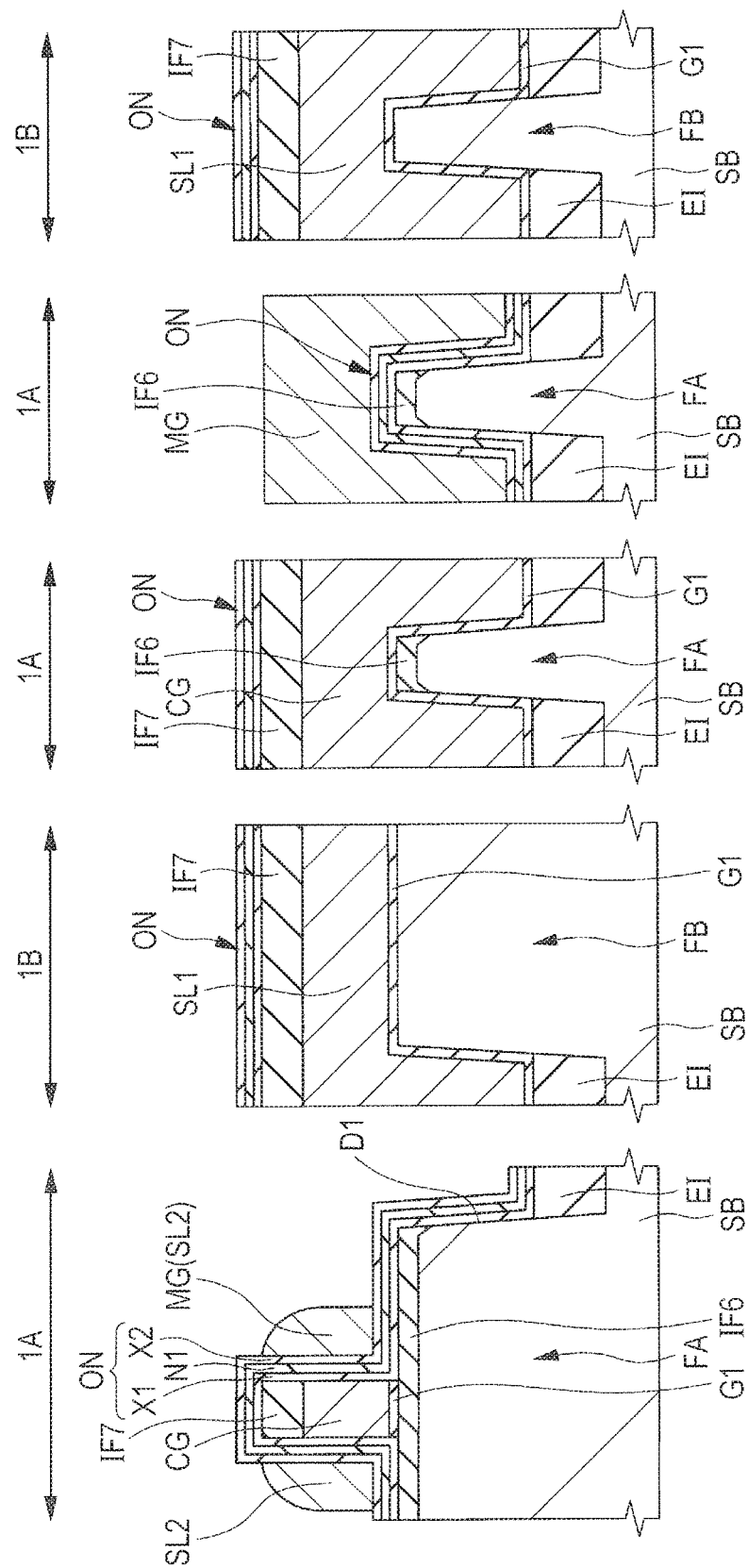
FIG. 14 includes sectional views explaining the manufacturing process of the semiconductor device following FIG. 13.

Subsequently, as shown in FIG. 14, thermal oxidation processing is performed to oxidize the surface of the fin FA, the surface of the insulating film IF6, and the side surfaces of the control gate electrode CG, which are exposed from the insulating film G1 and the element isolation region EI. As a result, a silicon oxide film (bottom oxide film) X1 is formed so as to cover the surface of the fin FA, the surface of the insulating film IF6, and the side surfaces of the control gate electrode CG. This process is now described assuming the surface of the element isolation region EI and the surface of the insulating film IF7 are covered by the silicon oxide film X1.

Subsequently, the silicon nitride film N1 is formed on the silicon oxide film X1 using, for example, a CVD process. The silicon nitride film N1 serves as a trapping insulating film for storing charges in a memory cell formed later. Although it has been described that the silicon nitride film N1 is formed as the charge storage film, an insulating film made of, for example, hafnium silicate (HfSiO) may be formed as a material of the charge storage film without being limited to the silicon nitride film. Subsequently, a silicon oxide film (top oxide film) X2 is formed on the silicon nitride film N1 using, for example, a CVD process.

A stacked film, which includes the silicon oxide film X1, the silicon nitride film N1, and the silicon oxide film X2 formed in order over the semiconductor substrate SB, configures the ONO film ON. The ONO film ON in contact with the side surface of the control gate electrode CG includes the silicon oxide film X1, the silicon nitride film N1, and the silicon oxide film X2 formed in the X direction in order from a control gate electrode CG side. A material of the top oxide film as the uppermost layer of the ONO film ON is not limited to silicon oxide, and may be alumina ($Al_2O_3$), for example. In the peripheral region 1B, the ONO film ON is formed on the insulating film IF7. The ONO film ON has a thickness of about 20 nm, for example.

Subsequently, a polysilicon film SL2 is formed on the ONO film ON using, for example, a CVD process. Subsequently, etchback is performed to expose the upper surface of the insulating film IF7 from the polysilicon film SL2. As a result, the polysilicon film SL2 is left in a sidewall spacer shape laterally on both sides of the control gate electrode CG. Consequently, the memory gate electrode MG including a pattern of the polysilicon film SL2 is formed on the ONO film ON in a region adjacent to one side surface in the X direction of the control gate electrode CG. The polysilicon film SL2 adjacent to the other side surface of the control gate electrode CG corresponds to a pattern to be removed in a later step and thus does not remain in the completed semiconductor device.

Figure 15:
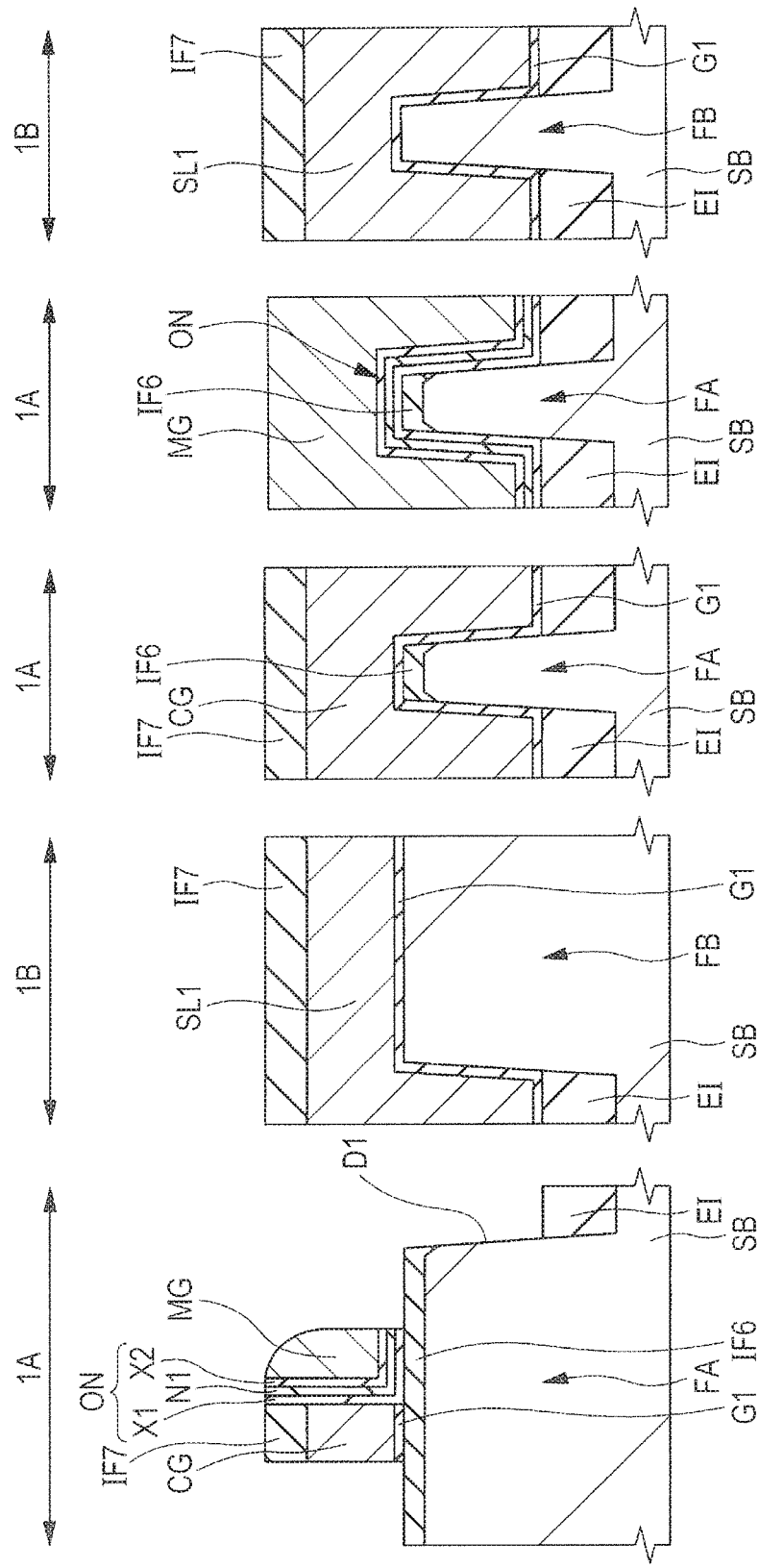
FIG. 15 includes sectional views explaining the manufacturing process of the semiconductor device following FIG. 14.

Subsequently, as shown in FIG. 15, a photolithography technique and an etching process are used to remove the polysilicon film SL2 adjacent to one side surface of a stacked film including the control gate electrode CG and the insulating film IF7. As a result, the memory gate electrode MG adjacent to the other side surface of the control gate electrode CG remains. Subsequently, the ONO film ON exposed from the control gate electrode CG and from the memory gate electrode MG is removed.

Specifically, the ONO film ON remains only between the memory gate electrode MG and the fin FA and between the memory gate electrode MG and the control gate electrode CG. In the memory cell region 1A, therefore, the side surfaces of the fin FA, the surface of the insulating film IF6, and the surface of the element isolation region EI are exposed from the ONO film ON in a region exposed from the control gate electrode CG and the memory gate electrode MG. The upper surface of the insulating film IF7 is exposed in the peripheral region 1B.

The ONO film ON extending along the surface of the fin FA and the ONO film ON extending along the side surface of the control gate electrode CG are continuously formed, and have an L-shaped section. While illustration is partially omitted, a pair of patterns are formed on the fin FA such that each pattern includes the control gate electrode CG and the memory gate electrode MG adjacent to each other with the ONO film ON in between, and a pair of memory gate electrodes MG are opposed to each other between a pair of control gate electrodes CG.

Figure 16:
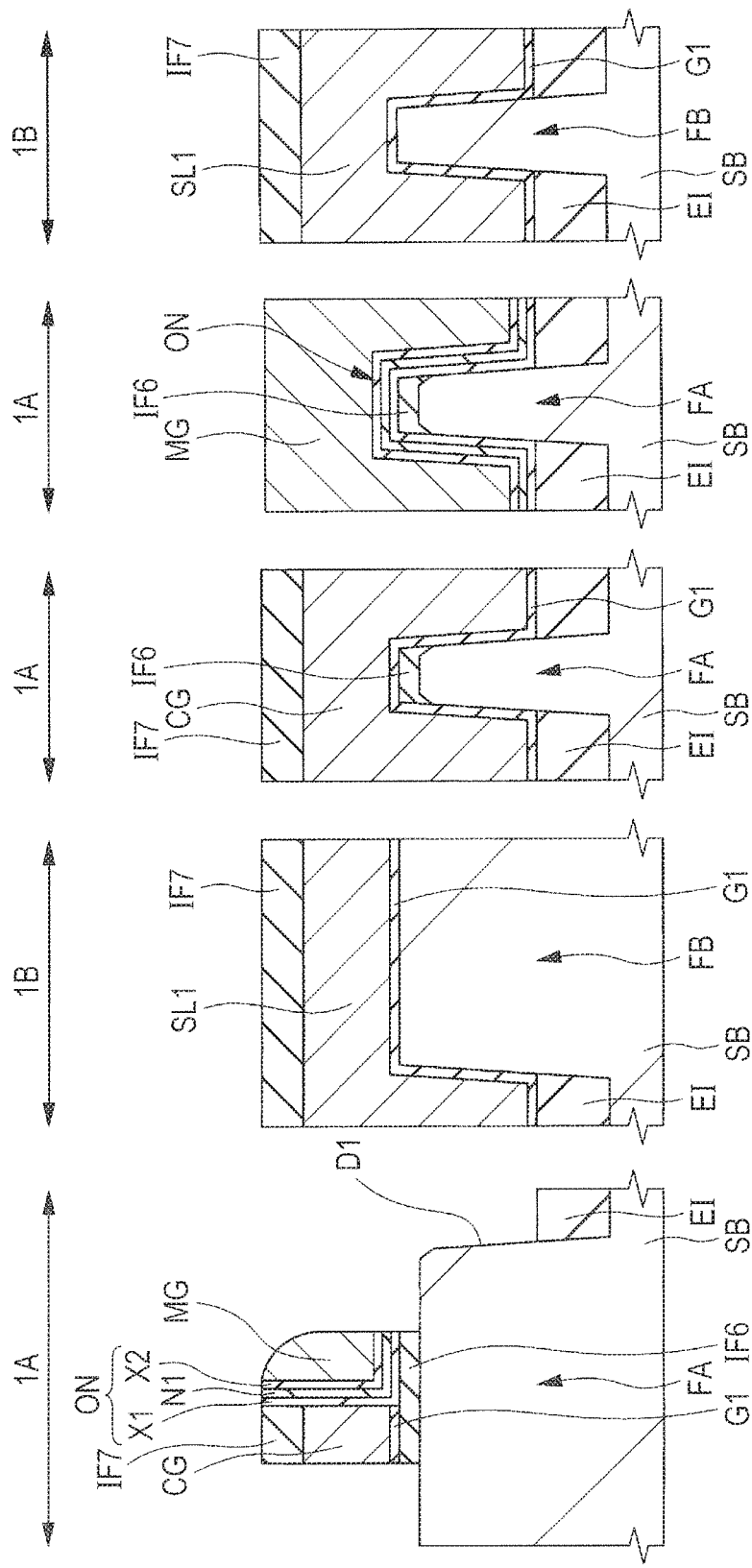
FIG. 16 includes sectional views explaining the manufacturing process of the semiconductor device following FIG. 15.

Subsequently, as shown in FIG. 16, the insulating film IF6 exposed from the control gate electrode CG, the ONO film ON, and the memory gate electrode MG are removed using an etching process. As a result, the upper surface and the corners of the fin FA are exposed.

Figure 17:
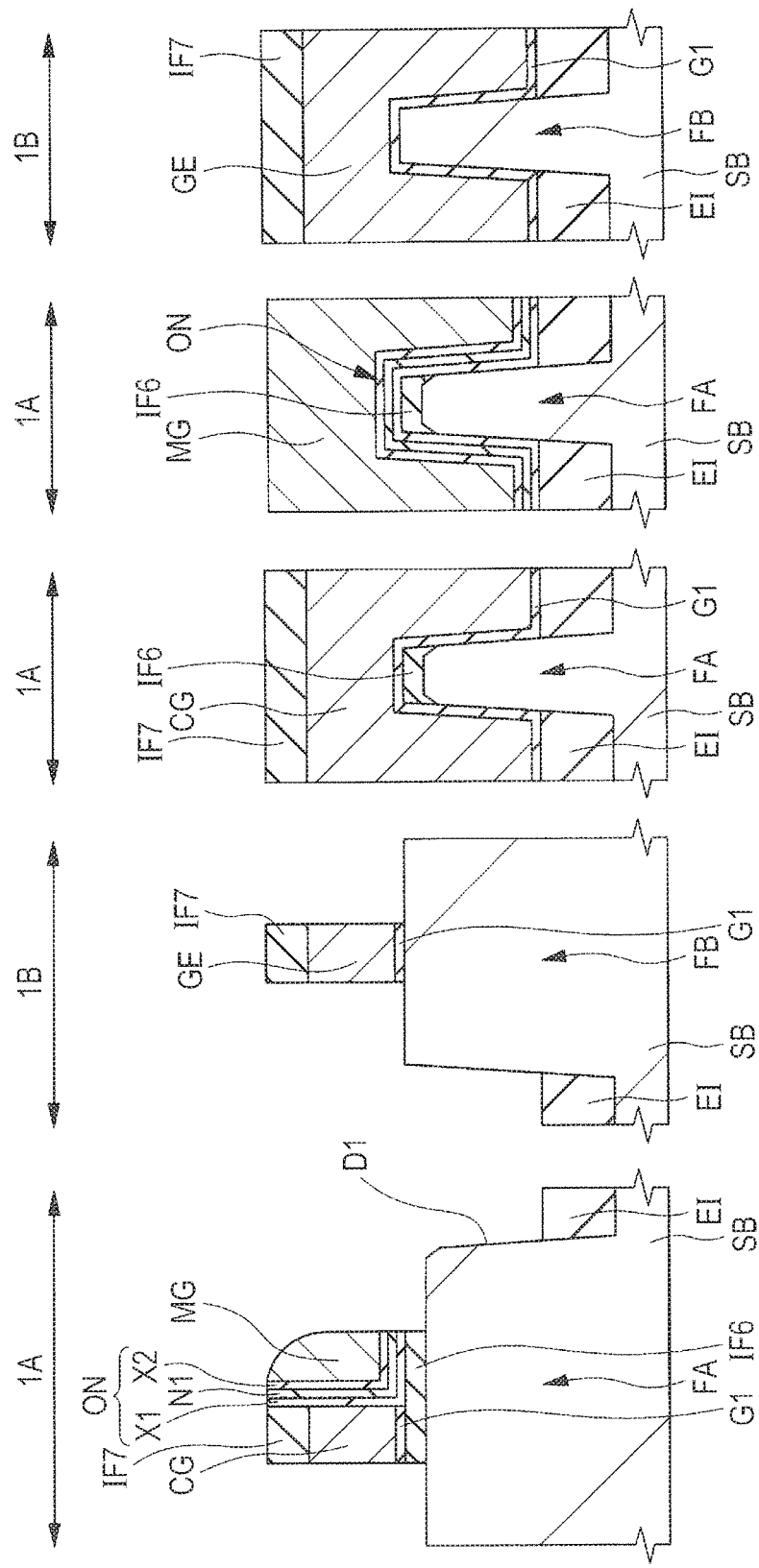
FIG. 17 includes sectional views explaining the manufacturing process of the semiconductor device following FIG. 16.

Subsequently, as shown in FIG. 17, a photolithography technique and a dry etching process are used to process the insulating film IF7 in the peripheral region 1B, and then process the polysilicon film SL1 and the insulating film G1. As a result, a stacked film, which includes the gate electrode GE including the polysilicon film SL1 and the overlying insulating film IF7, is formed over the fin FB. The stacked film extends in the Y direction. The fin FB is exposed in a region next to the gate electrode GE.

Figure 18:
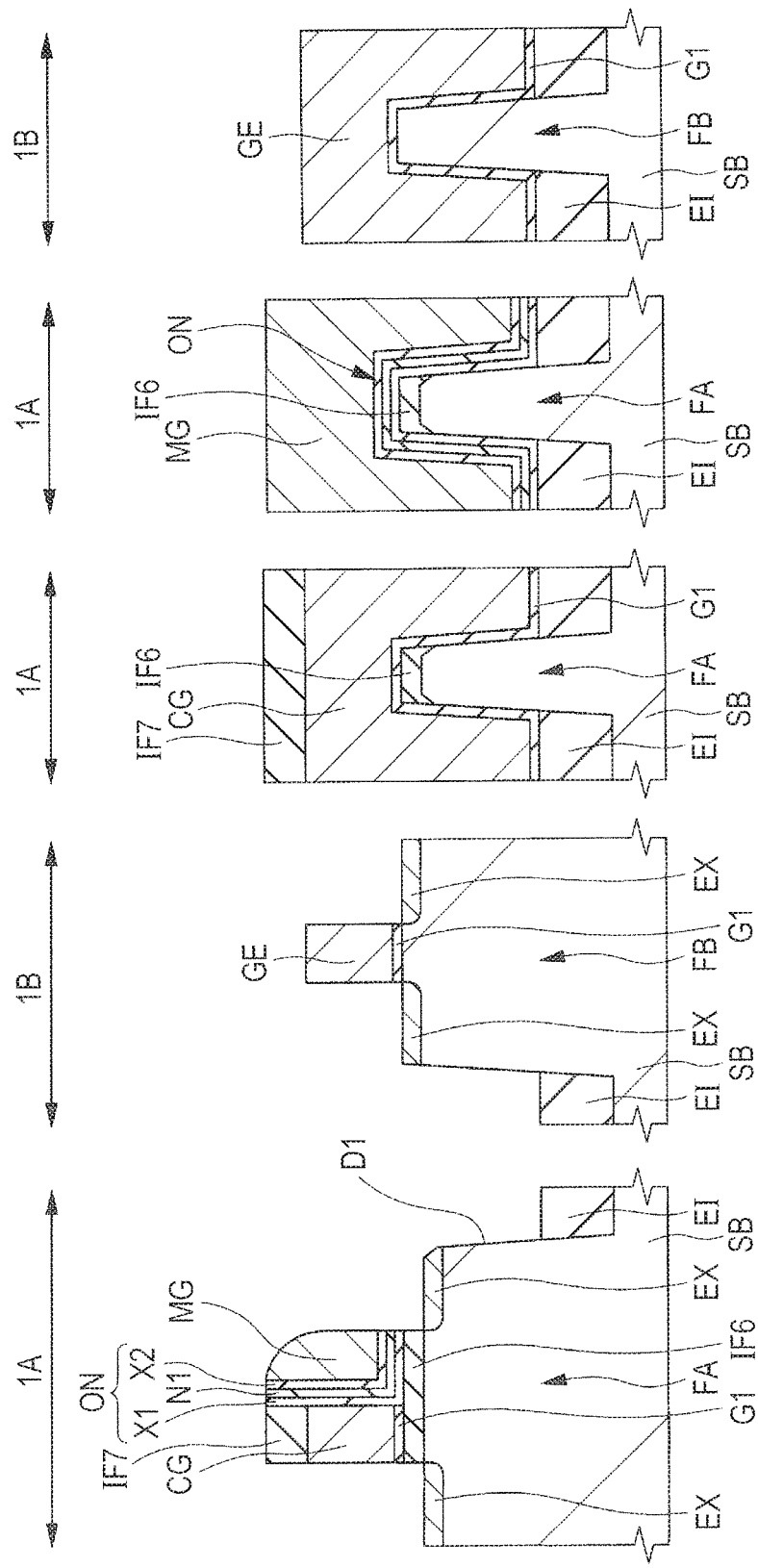
FIG. 18 includes sectional views explaining the manufacturing process of the semiconductor device following FIG. 17.

Subsequently, as shown in FIG. 18, an ion implantation step is performed using the insulating film IF7, the memory gate electrode MG, and the ONO film ON as a mask to implant an n-type impurity ((for example, phosphorus (P) or arsenic (As)) into each of the upper surfaces of the fins FA and FB. As a result, a plurality of extension regions EX, which are each an n-type semiconductor region having a relatively low impurity concentration, are formed. The extension region EX in the memory cell region 1A is formed in the upper surface of the fin FA next to the pattern including the control gate electrode CG and the memory gate electrode MG adjacent to each other with the ONO film ON in between. The extension region EX in the peripheral region 1B is formed in the upper surface of each fin FB portion next to the gate electrode GE. A p-type impurity (for example, boron (B)) may be implanted as halo implantation into the fins FA and FB as necessary.

Subsequently, a photolithography technique and an etching process are used to remove the insulating film IF7 on the gate electrode GE in the peripheral region 1B. As a result, the upper surface of the gate electrode GE is exposed.

Figure 19:
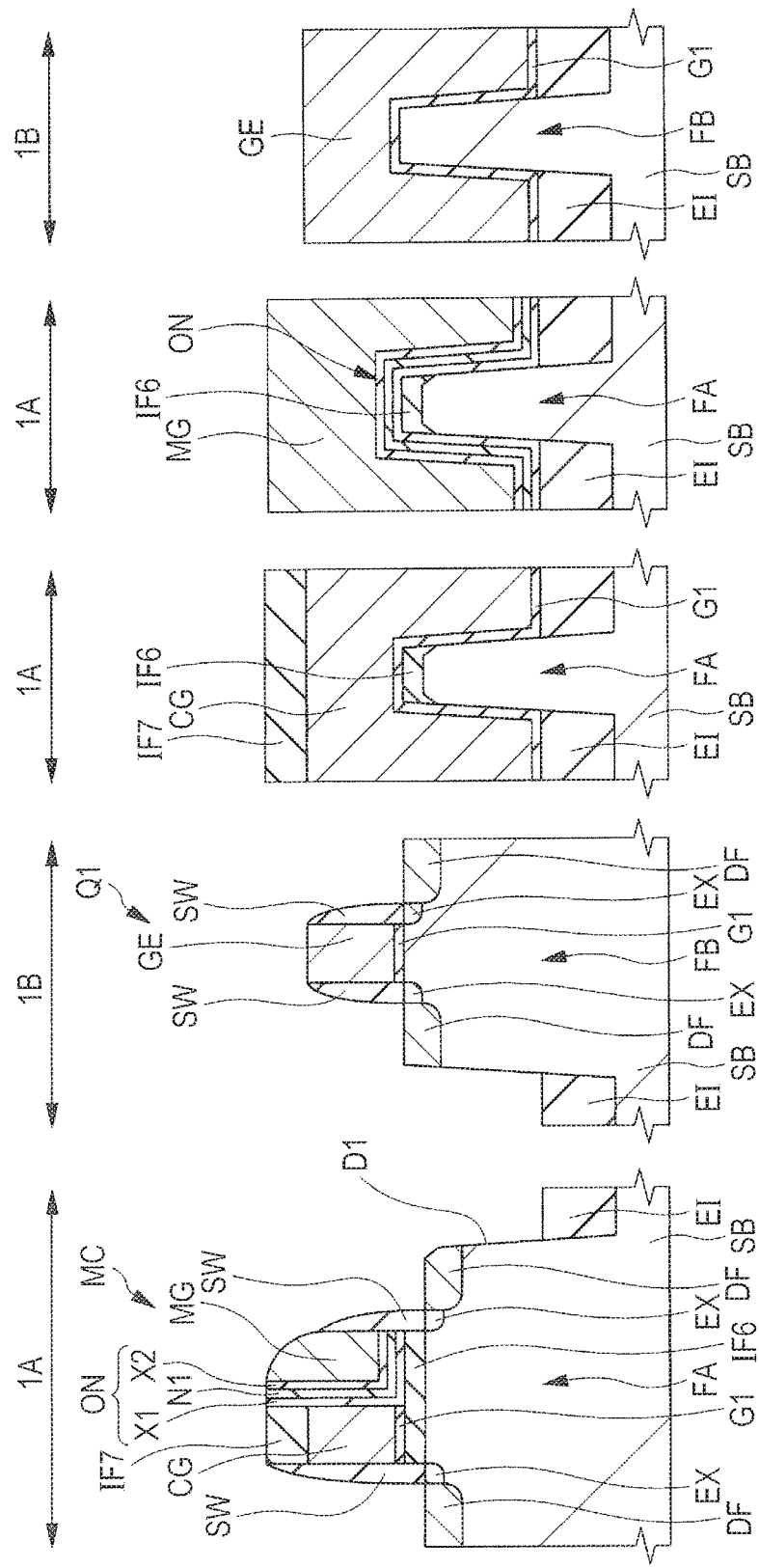
FIG. 19 includes sectional views explaining the manufacturing process of the semiconductor device following FIG. 18.

Subsequently, as shown in FIG. 19, an insulating film is formed over the semiconductor substrate SB using, for example, a CVD process. That insulating film includes, for example, a silicon oxide film, a silicon nitride film, or a stacked film thereof. Subsequently, dry etching is performed to expose the upper surfaces of the fins FA and FB and the insulating film IF7 from that insulating film. As a result, in the memory cell region 1A, a sidewall spacer SW including the insulating film is formed on the respective side surfaces on both sides of a pattern including the control gate electrode CG, the memory gate electrode MG, the ONO film ON, and the insulating films IF6 and IF7. In the peripheral region 1B, a sidewall SW including the insulating film is formed on the respective side surfaces on both sides of the gate electrode GE.

Subsequently, an ion implantation step is performed using the insulating film IF7, the memory gate electrode MG, the sidewall spacer SW, and the ONO film ON as a mask to implant an n-type impurity ((for example, phosphorus (P) or arsenic (As)) into each of the upper surfaces of the fins FA and FB. Consequently, a plurality of diffusion layers DF, which are each an n-type semiconductor region having a relatively high impurity concentration, are formed. The diffusion layer DF in the memory cell region 1A is formed in the upper surface of the fin FA next to the pattern including the control gate electrode CG and the memory gate electrode MG adjacent to each other with the ONO film ON in between. The diffusion layer DF in the peripheral region 1B is formed in the upper surface of each fin FB portion next to the gate electrode GE.

The diffusion layer DF is formed at a position distant from the control gate electrode CG, the memory gate electrode MG, or the gate electrode GE in the x direction compared with the extension region EX in contact with the diffusion layer DF. The diffusion layer DF has a larger depth and a higher impurity concentration than the extension region EX. The extension region EX and the diffusion layer DF in the upper surface and each side surface of each of the fins FA and FB. The extension region EX and the diffusion layer DF, which are in contact with each other, configure the source-drain regions of a transistor. Subsequently, heat treatment is performed as necessary to activate the impurity in each of the extension region EX and the diffusion layer DF.

Although it has been described that the source-drain regions in each of the memory cell region 1A and the peripheral region 1B are formed in the same step, the extension regions EX and the diffusion layers DF in the respective regions may be formed indifferent steps. Although it has been described that the source-drain regions are formed by ion implantation, an epitaxial layer containing an impurity introduced therein may be formed using an epitaxial growth process on the surface of the fin next to each gate electrode in place of the ion implantation.

In the memory cell region 1A, a split-gate memory cell MC is configured by the control gate electrode CG, the memory gate electrode MG, and the source-drain regions each including the extension region EX and the diffusion layer DF formed on either side of the pattern including the control gate electrode CG and the memory gate electrode MG. Specifically, the memory cell MC configures a MONOS nonvolatile memory including a first transistor (control transistor) including the control gate electrode CG and a second transistor (memory transistor) including the memory gate electrode MG. In the peripheral region 1B, the gate electrode GE and the source-drain regions, each including the extension region EX and the diffusion layer DF, formed on both sides of the gate electrode GE configure a low-withstand-voltage transistor Q1.

Figure 20:
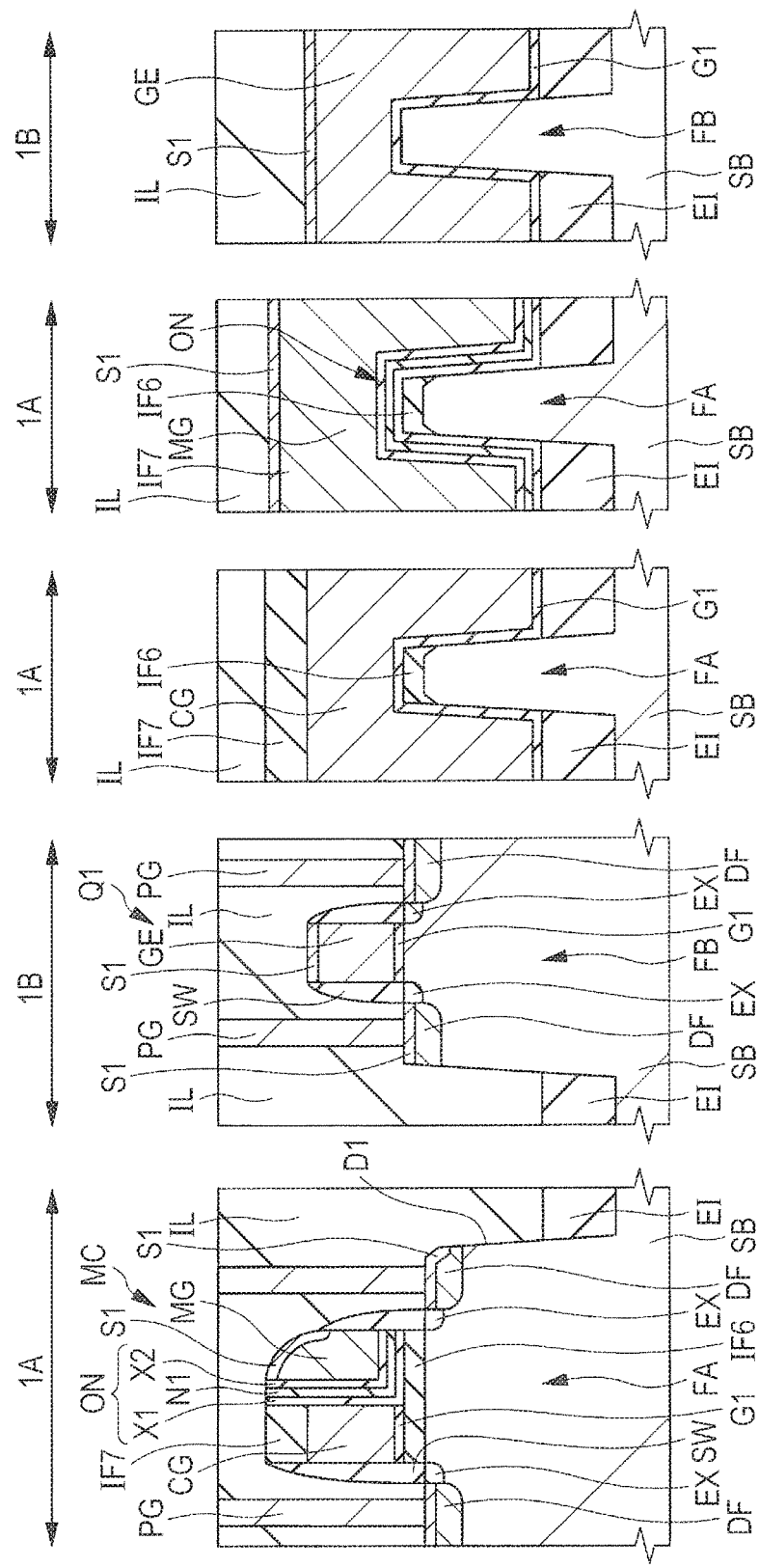
FIG. 20 includes sectional views explaining the manufacturing process of the semiconductor device following FIG. 19.

Subsequently, as shown in FIG. 20, the silicide layer S1 is formed so as to cover the upper surfaces of the control gate electrode CG, the memory gate electrode MG, the gate electrode GE, and the fins FA and FB. However, FIG. 20 does not show the silicide layer formed on the control gate electrode CG. The upper surface of the control gate electrode CG is exposed from the insulating film IF7 in an undepicted region, and the silicide layer is formed in that region so as to cover the control gate electrode CG.

A metal film including a nickel (Ni) film or a cobalt (Co) film is formed on the exposed control gate electrode CG, memory gate electrode MG, gate electrode GE, and fins FA and FB using, for example, a sputtering process, and then the metal film is subjected to heat treatment to react the metal film with each of the control gate electrode CG, the memory gate electrode MG, the gate electrode GE, and the fins FA and FB.

Consequently, the silicide layer S1 including a nickel silicide (NiSi) layer or a cobalt silicide (CoSi) layer is formed so as to cover the upper surfaces of the control gate electrode CG, the memory gate electrode MG, the gate electrode GE, and the fins FA and FB, and then the unreacted metal film is removed by wet etching or the like.

Subsequently, an undepicted insulating film including, for example, a silicon nitride film having a thickness of 5 to 20 nm and the interlayer insulating film IL including, for example, a silicon oxide film are formed in order using, for example, a CVD process. The interlayer insulating film IL has a larger thickness than at least the control gate electrode CG, and has a larger thickness than the stacked film including the insulating film G1, the control gate electrode CG, and the insulating film IF7 herein. The interlayer insulating film IL is formed so as to fill the inside of the trench D1 on the element isolation region EI. Subsequently, the upper surface of the interlayer insulating film IL is planarized by polishing using a CMP process, for example.

Subsequently, a plurality of contact plugs (conductive coupling parts) are formed so as to penetrate the interlayer insulating film IL and to be coupled to the control gate electrode CG, the memory gate electrode MG, the source region, the drain region, or the gate electrode GE, thereby the semiconductor device of the first embodiment is completed.

Specifically, a photolithography technique and a dry etching process are used to forma plurality of contact holes that penetrate an interlayer insulating film including the interlayer insulating film IL and an overlying interlayer insulating film. The contact holes are openings that expose the respective upper surfaces of the diffusing layer DF configuring the source-drain regions of the memory cell MC, the diffusing layer DF configuring the source-drain regions of the transistor Q1, the control gate electrode CG, the memory gate electrode MG, and the gate electrode GE. The upper surface of the silicide layer S1 is exposed at the bottom surface of the contact hole directly over each of the control gate electrode CG and the memory gate electrode MG.

Subsequently, a metal film mainly including, for example, tungsten (W) is formed as a conductive film for coupling on the interlayer insulating film including the inside of the contact hole using, for example, a sputtering process to completely fill the inside of each contact hole. In this process, a barrier conductor film including, for example, a titanium (Ti) film, a titanium nitride (TiN) film, or a stacked film of such films is formed, and then a main conductor film including a tungsten film is formed on the barrier conductor film, thereby the metal film including the barrier conductor film and the main conductor film is formed. Subsequently, the unnecessary metal film on the interlayer insulating film is removed by a CMP process or the like to form the contact plug PG buried in each contact hole. The contact plug PG is electrically coupled to the control gate electrode CG, the memory gate electrode MG, the source region, the drain region, or the gate electrode GE. Subsequently, a stacked interconnection layer including an interconnection coupled to the contact plug PG is formed on the interlayer insulating film IL.

Figure 33:
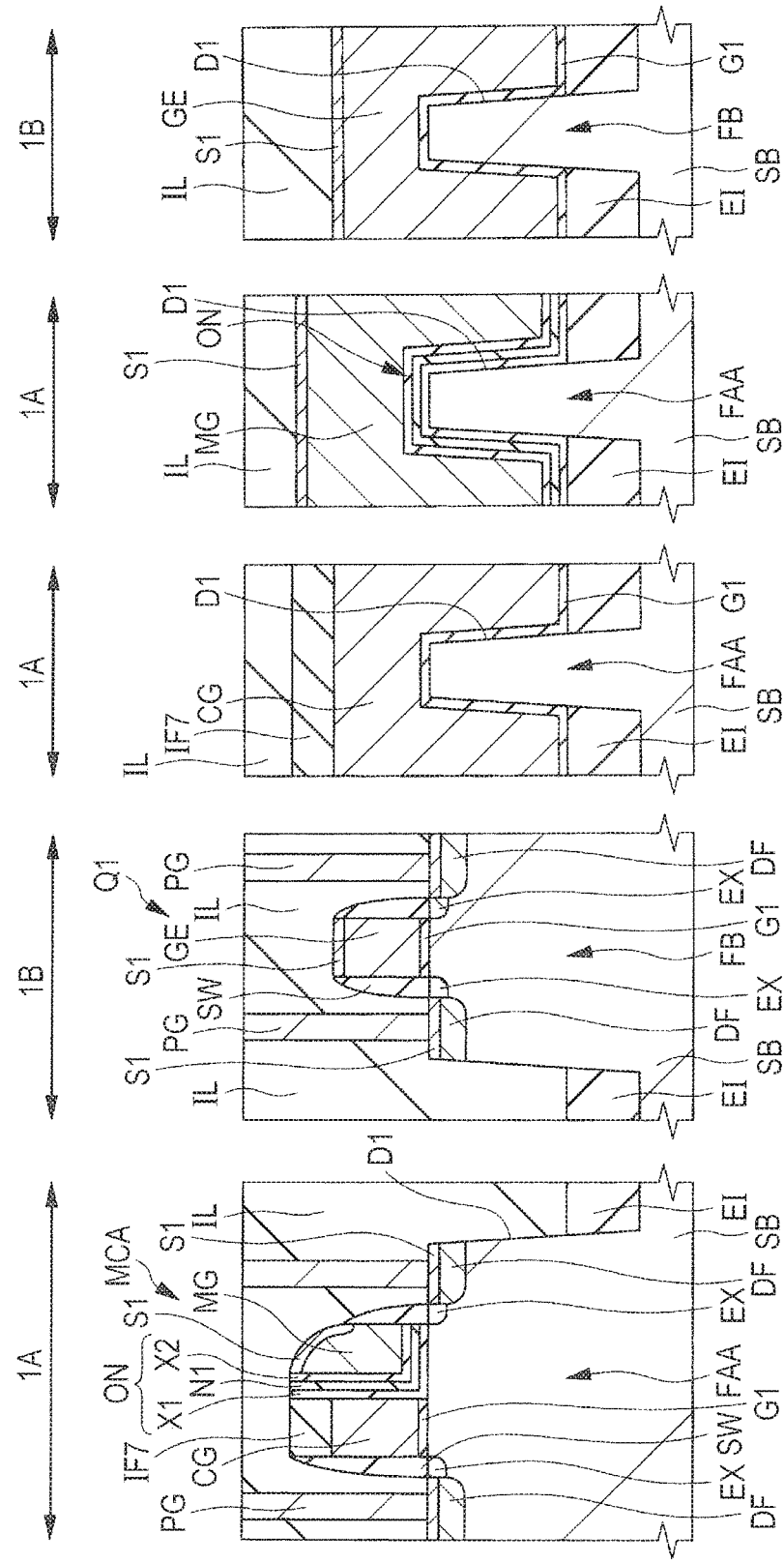
FIG. 33 includes sectional views of a semiconductor device of a comparative example.

Effects of Semiconductor Device and Method of Manufacturing the Semiconductor Device Effects of the semiconductor device and the method of manufacturing the semiconductor device of the first embodiment are described below with reference to FIG. 33 illustrating a comparative example. FIG. 33 includes sectional views illustrating a semiconductor device of the comparative example, each sectional view including a memory cell including a FINFET. The sections shown in FIG. 33 each show the memory cell region 1A or the peripheral region 1B in correspondence to the sections shown in FIG. 2.

The semiconductor device of the comparative example shown in FIG. 33 includes a memory cell MCA formed on a fin FAA in the memory cell region 1A and a transistor Q1 formed on the fin FB in the peripheral region 1B. However, the semiconductor device of the comparative example has a structure similar to that of the semiconductor device of the first embodiment described with reference to FIGS. 1 and 2 except that the insulating film IF6 is not formed on the upper surface of the fin FAA. Since the insulating film IF6 is not formed in the semiconductor device of the comparative example, height of the upper surface of the fin FAA is similar to that of the fin FB. The corner of the fin FAA is angulate as with the corner of the fin FB. The control gate electrode CG is formed over the fin FAA with the insulating film G1 as a gate insulating film in between. The memory gate electrode MG is formed over the fin FAA with the ONO film ON as a gate insulating film in between.

In the memory cell MCA including the FINFET, the side surfaces of the fin FAA can be used as a channel in addition to the upper surface thereof. It is therefore possible to reduce device size and manufacturing cost, and improve device performance compared with a memory cell configured by a transistor formed on an upper surface of a flat bulk silicon substrate.

A MONOS memory importantly has a disturb (erroneous write) resistance at a bit close to an objective bit for write. Influence of disturb varies depending on the respective electric potentials of the memory gate electrode, the control gate electrode, the source region, and the drain region of a bit subjected to the disturb. When only a drain voltage is different from a drain voltage applied to the objective bit (selected cell) among voltages applied to non-objective bits (unselected cells), the influence of disturb is most strong.

That is, for example, during write operation, when the memory cell MCA shown in FIG. 33 is an unselected cell, voltages applied to various parts of the memory cell MCA as the unselected cell are Vmg=10 V, Vs=5 V, Vcg=1 V, Vd=1.5 V, and Vb=0 V. Since 10 V is applied to the memory gate electrode MG, an inversion layer extending from the source region is formed in the upper surface of the fin FAA directly below the memory gate electrode MG, and the inversion layer has an electric potential of 5 V corresponding to a voltage applied to the source region.

In such a case, gate induced drain leakage (GIDL) occurs in a channel region between the memory gate electrode MG and the control gate electrode CG due to a large potential difference between the upper surface (5 V) of the fin FAA directly below the memory gate electrode MG and the control gate electrode CG (1 V). At this time, some electrons are trapped in the ONO film ON from within the fin directly below the memory gate electrode MG, leading to erroneous write. The GIDL means that electrons flow from the source region into the semiconductor substrate SB due to a difference in electric field between the upper surface of the fin FAA directly below the memory gate electrode MG and the control gate electrode CG. Some of such electrons are trapped in the ONO film ON at a relatively high probability, leading to disturb.

In the fin MONOS memory, since an electric field concentrates at the upper end of the fin FAA at the disturb, the GIDL particularly tends to occur, and disturb resistance is deteriorated. Since a lateral end portion (corner) of the upper end of the fin FAA is angulate, the electric field particularly tends to concentrate at the end portion. The GIDL therefore significantly occurs at the corner of the fin FAA. In addition, gate withstand voltage is disadvantageously lowered due to the electric field concentration at the corner of the fin FAA.

If a voltage applied to the control gate electrode CG is higher than 1 V to reduce the potential difference (electric field difference) and suppress the GIDL, leakage current increases between the source region and the drain region. Conversely, if the voltage applied to the control gate electrode CG is lower than 1 V, the potential difference increases and thus the electric field increases at the upper end of the fin FAA and thus the GIDL tends to occur, leading to a short disturb life of the semiconductor device.

On the other hand, in the first embodiment, as shown in FIG. 2, the insulating film IF6 thicker than the insulating film G1 is formed below each of the control gate electrode CG and the memory gate electrode MG. That is, thickness of each of the control transistor and the memory transistor is larger in a portion covering the upper surface of the fin FA, at which the electric field tends to concentrate, than in a portion covering the side surface of the fin FA. This makes it possible to increase a distance between the upper surface of the fin FA directly below the memory gate electrode MG and the memory gate electrode MG. It is therefore possible to reduce the electric field at the upper end of the fin FA. In particular, it is possible to reduce the electric field in the perpendicular direction directly below the memory gate electrode MG.

This makes it possible to prevent occurrence of the GPDL. Even if electrons flow from the source region toward the semiconductor substrate SB due to the GIDL in an unselected cell, the large distance between the memory gate electrode MG and the upper surface of the fin FA directly below the memory gate electrode MG makes it possible to reduce the probability of trapping of electrons by the ONO film ON. It is therefore possible to prevent occurrence of the erroneous write phenomenon in which electrons are trapped by the ONO film ON in an unselected cell during write.

The corner of the fin FA is round due to formation of the bird's beak including the end portion of the insulating film IF6, which makes it possible to reduce the electric field at the corner of the fin FA below each of the control gate electrode CG and the memory gate electrode MG. It is therefore possible to increase the gate withstand voltage, and prevent occurrence of the GIDL. It is therefore possible to prevent occurrence of the erroneous write. In this way, reliability of the semiconductor device can be improved.

Figure 21:
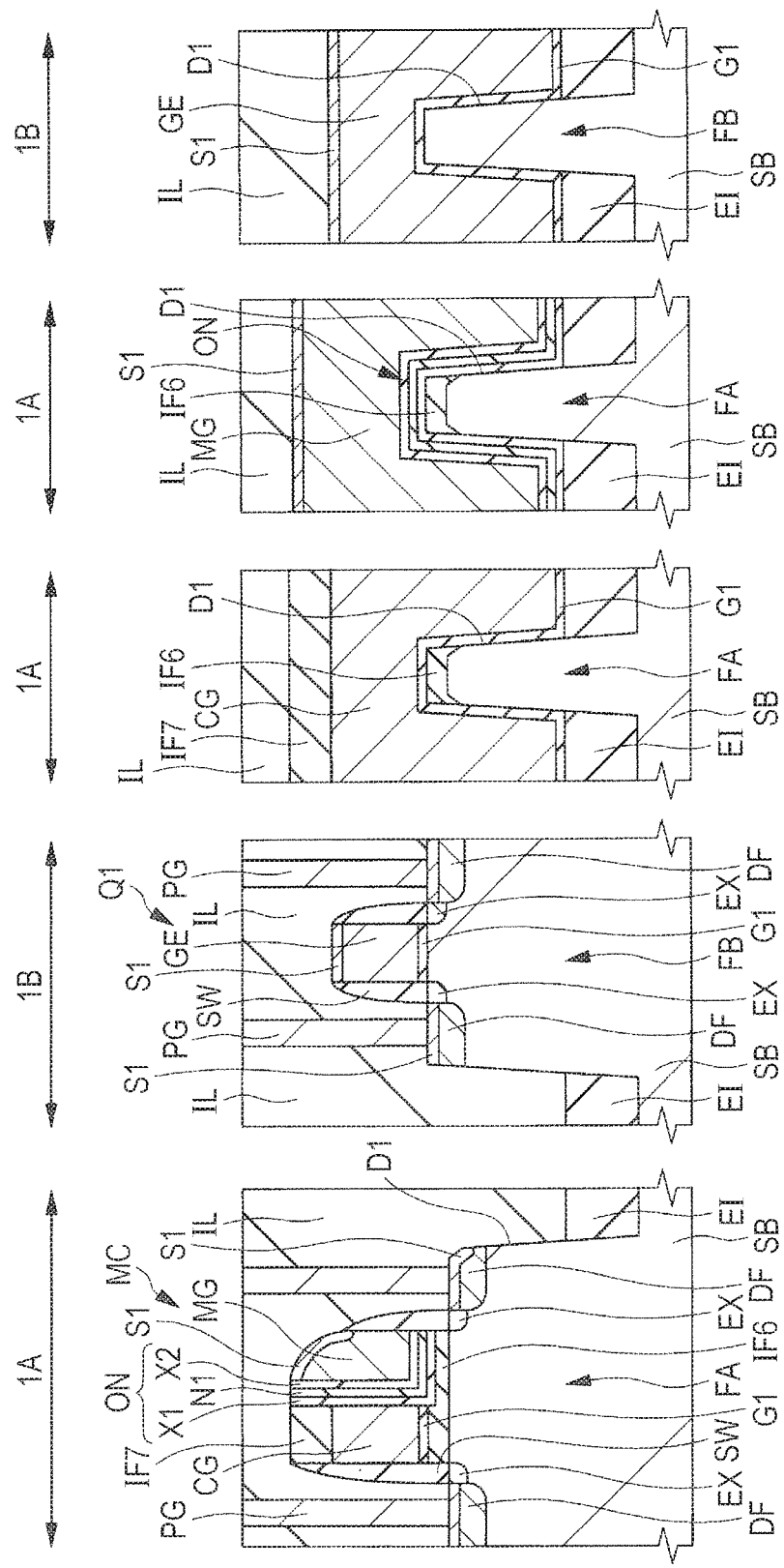
FIG. 21 includes sectional views of the semiconductor device of the first embodiment.
Figure 22:
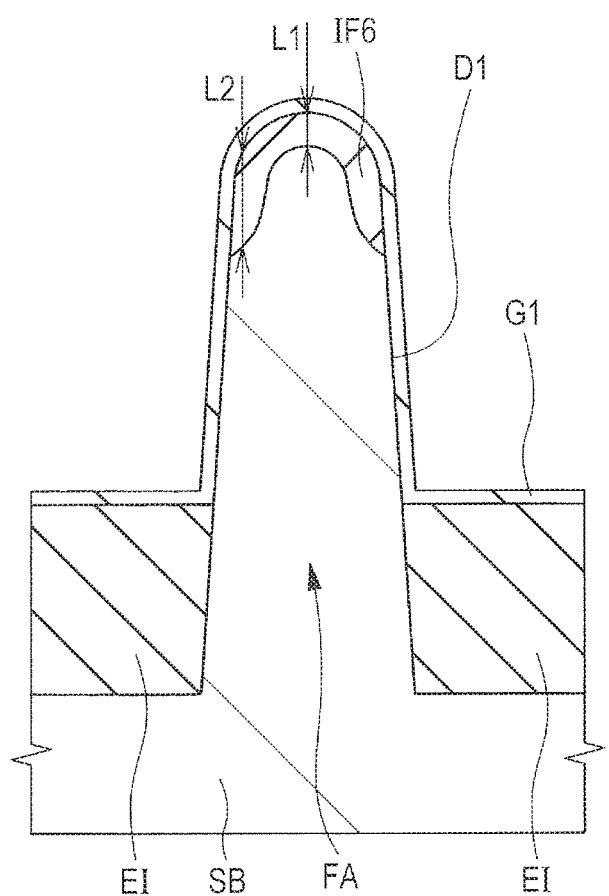
FIG. 22 is an enlarged sectional view of the semiconductor device of the first embodiment.

An exemplary shape of the semiconductor device of the first embodiment is now described with reference to FIGS. 21 and 22. FIG. 21 includes sectional views of the semiconductor device of the first embodiment, showing the same regions as those of FIG. 2. FIG. 22 is an enlarged sectional view showing the same region as that of FIG. 3. FIG. 22 does not show the structure (for example, the control gate electrode) over the fin FA except for the insulating films G1 and IF6.

As shown in FIG. 21, thickness of the insulating film IF6 directly below the memory gate electrode MG is considered to be smaller than thickness of the insulating film IF6 directly below the control gate electrode CG. This is because the upper surface of the insulating film IF6, which is adjacent to the stacked pattern including the control gate electrode CG and the insulating film G1, is retracted through the processing step of the control gate electrode CG and the insulating film G1 and the subsequent cleaning step as described with reference to FIG. 13, and the memory gate electrode MG is formed over the retracted upper surface. It is therefore considered that the upper surface of the insulating film IF6 has a difference in level near a region between the control gate electrode CG and the memory gate electrode MG, and a position of the upper surface of the insulating film IF6 directly below the memory gate electrode MG is lower than a position of the upper surface of the insulating film IF6 directly below the control gate electrode CG.

As described above, when the thickness directly below the memory gate electrode MG is small, it is possible to prevent erasing speed of the memory cell MC as a nonvolatile memory element from being reduced due to formation of the insulating film IF6. Consequently, erroneous write can be prevented while performance of the memory cell MC is maintained.

As shown in FIG. 22, the upper end (tip) of the fin FA is considered to be round. This is because even if the fin FA is designed to be formed as a rectangular prism, the corner of the fin FA actually tends to be shaved and rounded during processing. In particular, when size reduction of the semiconductor device proceeds and thus the fin FA has a small width in a short direction, the upper surface of the fin FA may have substantially no horizontal plane as shown in FIG. 22.

As described above, even if the corner of the fin FA is relatively round, since the electric field tends to concentrate at the corner, the corner of the fin FA can be further rounded by forming the insulating film IF6 covering the upper surface and the corners of the fin FA. Even in such a case, the bird's beak is formed at the end portion of the insulating film IF6 and the side surfaces of the fin FA are partially oxidized, thereby the thickness of the insulating film IF6 in the direction perpendicular to the main surface of the semiconductor substrate SB is large in the end portion than in the central portion in the Y direction of the insulating film IF6. As a result, it is possible to provide effects similar to the effects of the semiconductor device and the method of manufacturing the semiconductor device as described with reference to FIGS. 1 to 20. The insulating film IF6 shown in FIGS. 3 and 22 continuously covers the upper surface of the fin FA and the upper ends of each side surface of the fin FA. In other words, the insulating film IF6 continuously covers the upper surface and the side surfaces of the upper end of the fin FA.

The structure as shown in FIG. 22 is mentioned in other expression as follows. That is, the side surfaces of the fin FA includes a first side surface and a second side surface as the two side surfaces in the X direction (gate length direction). In such a case, a part (bird's beak portion) of the insulating film IF6 is contained in a region surrounded by a first line along the first side surface and orthogonal to the X direction, a second line along the second side surface and orthogonal to the X direction, a third line passing on the uppermost surface of the fin FA and parallel to the Y direction, and a fourth line along the upper surface of the semiconductor substrate SB and along the Y direction. The upper surface of the semiconductor substrate SB mentioned herein is the upper surface of the semiconductor substrate SB directly below the element isolation region EI next to the fin FA. That is, the fourth line is along the bottom surface of the element isolation region EI, and passes on the lower end of the fin FA. The part (bird's beak portion) of the insulating film IF6 is contained in the region surrounded by the first to fourth lines. This means that the part (bird's beak portion) of the insulating film IF6 is formed eroding part of each of the first and second side surfaces of the fin FA in a region below the uppermost surface of the fin FA.

The gate insulating film including the insulating films IF6 and G1 as shown in FIGS. 3 and 22 has a thickness that is larger in a portion covering the upper end of each side surface in a region covering the entire side surface than in a portion covering a side surface portion below that upper end.

Such a structure makes it possible to round the corner of the fin FA and thus reduce the electric filed at the corner of the fin FA.

Second Embodiment

In the following case, a thick insulating film is formed only below the control gate electrode, but is not formed below the memory gate electrode.

Figure 23:
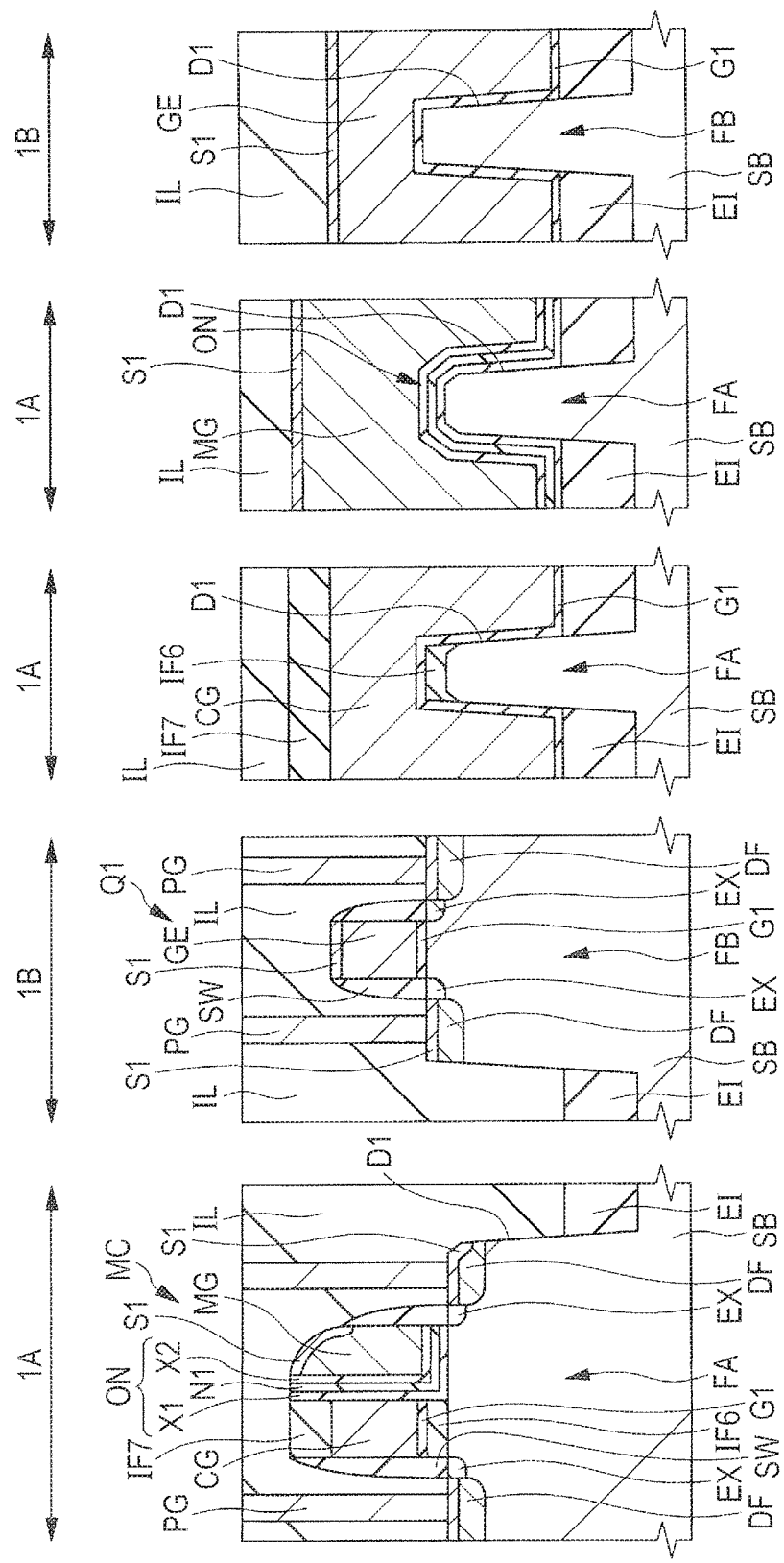
FIG. 23 includes sectional views of a semiconductor device of a second embodiment of the invention.

FIG. 23 shows sectional views of a semiconductor device of a second embodiment. FIG. 23 includes the sectional views showing regions corresponding to those of FIG. 2. The structure shown in FIG. 23 is the same as the structure shown in FIG. 2 except that the insulating film IF6 is not formed directly below the memory gate electrode MG. That is, the memory gate electrode MG is formed over a side surface of a stacked pattern including the insulating film IF6, the insulating film G1, the control gate electrode CG, and the insulating film IF7 with the ONO film ON in between, and the bottom surface of the ONO film ON is in contact with the upper surface of the fin FA directly below the memory gate electrode MG. A side surface of the ONO film ON is in contact with the side surface of the insulating film IF6.

Figure 24:
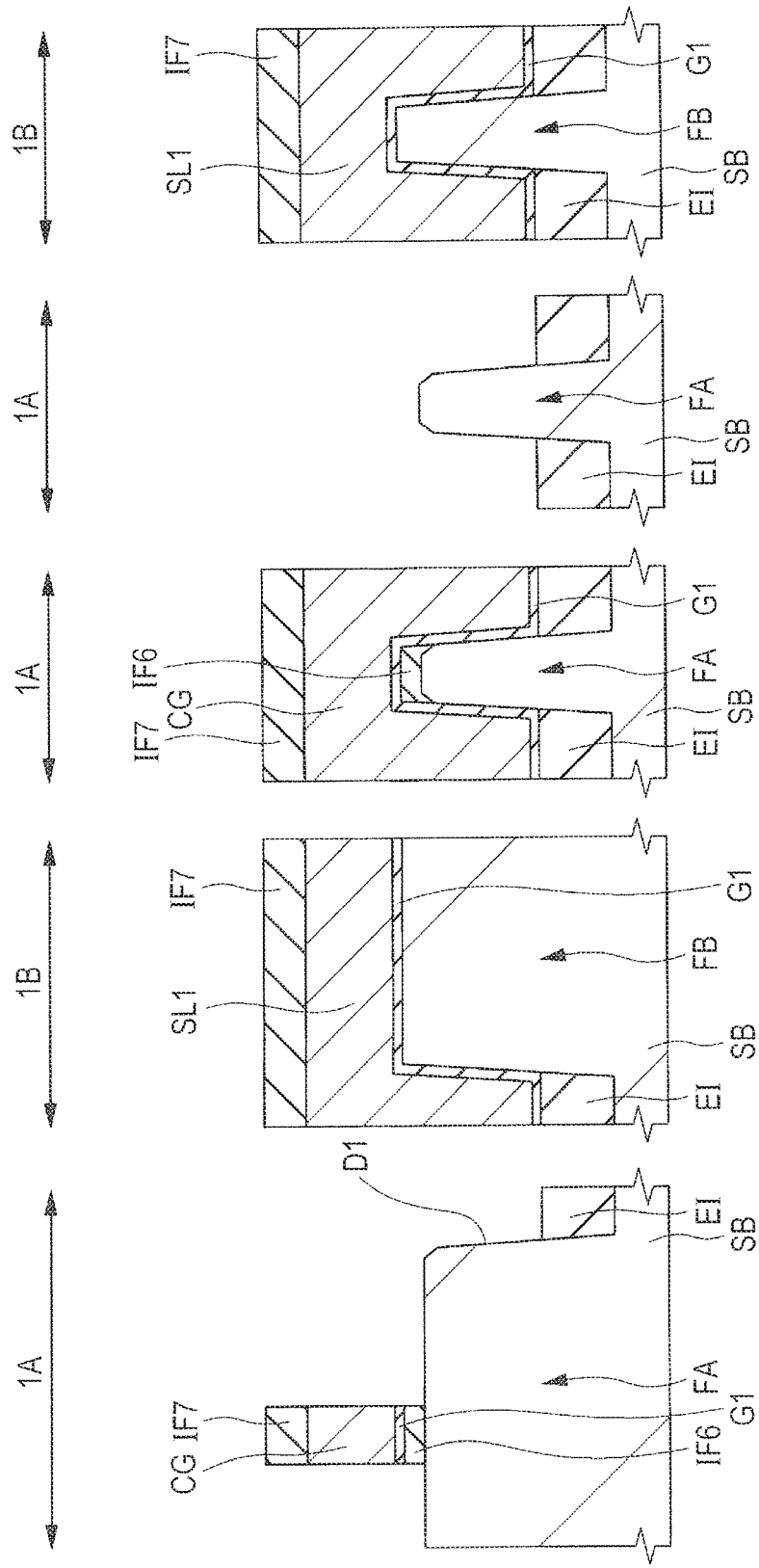
FIG. 24 includes sectional views explaining a manufacturing process of the semiconductor device of the second embodiment.
Figure 25:
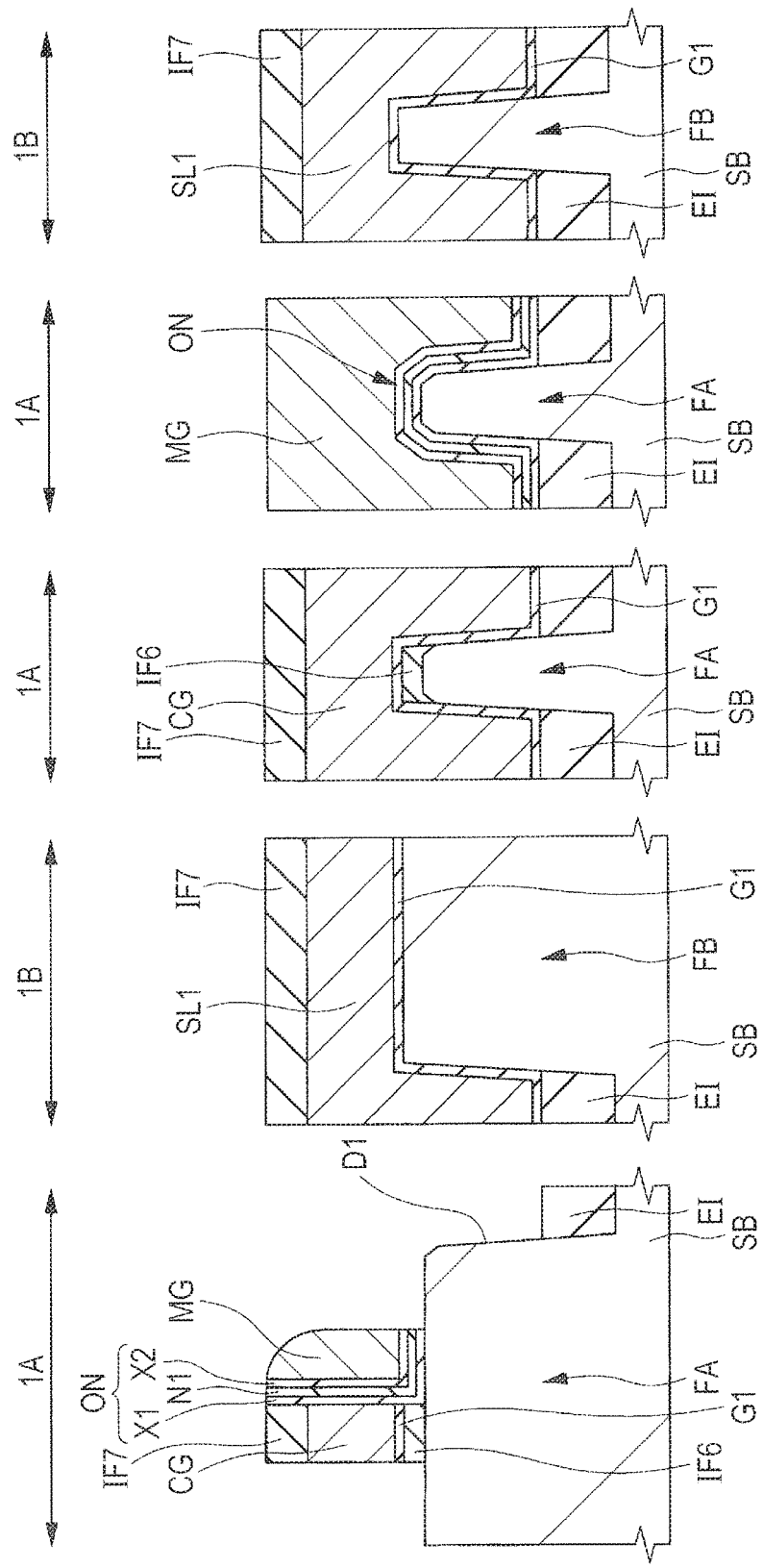
FIG. 25 includes sectional views explaining the manufacturing process of the semiconductor device following FIG. 24.

A manufacturing process to form such a structure is described with reference to FIGS. 24 and 25. FIGS. 24 and 25 each include sectional views explaining a manufacturing process of the semiconductor device of the second embodiment. FIGS. 24 and 25 each include sectional views showing the same regions as those of FIG. 23.

First, steps similar to the steps described with reference to FIGS. 4 to 13 are performed. Subsequently, as shown in FIG. 24, a stacked pattern including the insulating film G1, the control gate electrode CG, and the insulating film IF7 is used as a mask to perform etching, so that the insulating film IF6 is removed and thus the upper surface of the fin FA is exposed. That is, the insulating film IF6 remains only directly below the control gate electrode CG.

Subsequently, as shown in FIG. 25, steps similar to the steps described with reference to FIGS. 14 and 15 are performed to form the memory gate electrode MG adjacent to one side surface of the control gate electrode CG with the ONO film ON in between. Subsequently, steps similar to the steps described with reference to FIGS. 17 to 20 are performed to complete the semiconductor device shown in FIG. 23.

The upper surface of the fin FA directly below the memory gate electrode MG is not covered with the insulating film IF6. That is, in the manufacturing process, while the insulating film IF6 is first formed so as to cover that upper surface of the fin FA, it is removed from the upper surface directly below the memory gate electrode MG, and then the memory gate electrode MG is formed on the upper surface. Height of the upper surface of the fin FA directly below the memory gate electrode MG is therefore lower than the height of the fin FB, and the end portion (corner) in the Y direction of the fin FA is round.

Effects of the second embodiment are described below.

In the second embodiment, as shown in FIG. 23, the gate insulating film including the insulating film G1 and the insulating film IF6 thicker than the insulating film G1 is formed between the upper surface of the fin FA and the control gate electrode CG. This makes it possible to increase the distance between the upper surface of the fin FA directly below the control gate electrode CG and the control gate electrode CG. It is therefore possible to reduce the electric field at the upper end of the fin FA. This makes it possible to prevent occurrence of the GPDL. Consequently, it is possible to prevent occurrence of the erroneous write phenomenon in which electrons are trapped by the ONO film ON in an unselected cell during write.

The corner of the fin FA directly below the control gate electrode CG is round due to formation of the bird's beak including the end portion of the insulating film IF6. The corner of the fin FA directly below the memory gate electrode MG is temporarily covered with the insulating film IF6, and subsequently the insulating film IF6 is removed in the manufacturing process. This allows the corner of the fin FA directly below the memory gate electrode MG to be round. As a result, it is possible to reduce the electric field at the corner of the fin FA below each of the control gate electrode CG and the memory gate electrode MG. It is therefore possible to increase the gate withstand voltage, and prevent occurrence of the GIDL. Consequently, occurrence of the erroneous write can be prevented.

The thick insulating film IF6 is not formed between the upper surface of the fin FA and the memory gate electrode MG. This makes it possible to prevent a reduction in erasing speed due to an increase in thickness of the gate insulating film of the memory transistor. In this way, reliability of the semiconductor device can be improved while a reduction in performance of the semiconductor device is prevented.

Third Embodiment

In the following case, a thick insulating film is formed only below the memory gate electrode, but is not formed below the control gate electrode.

Figure 26:
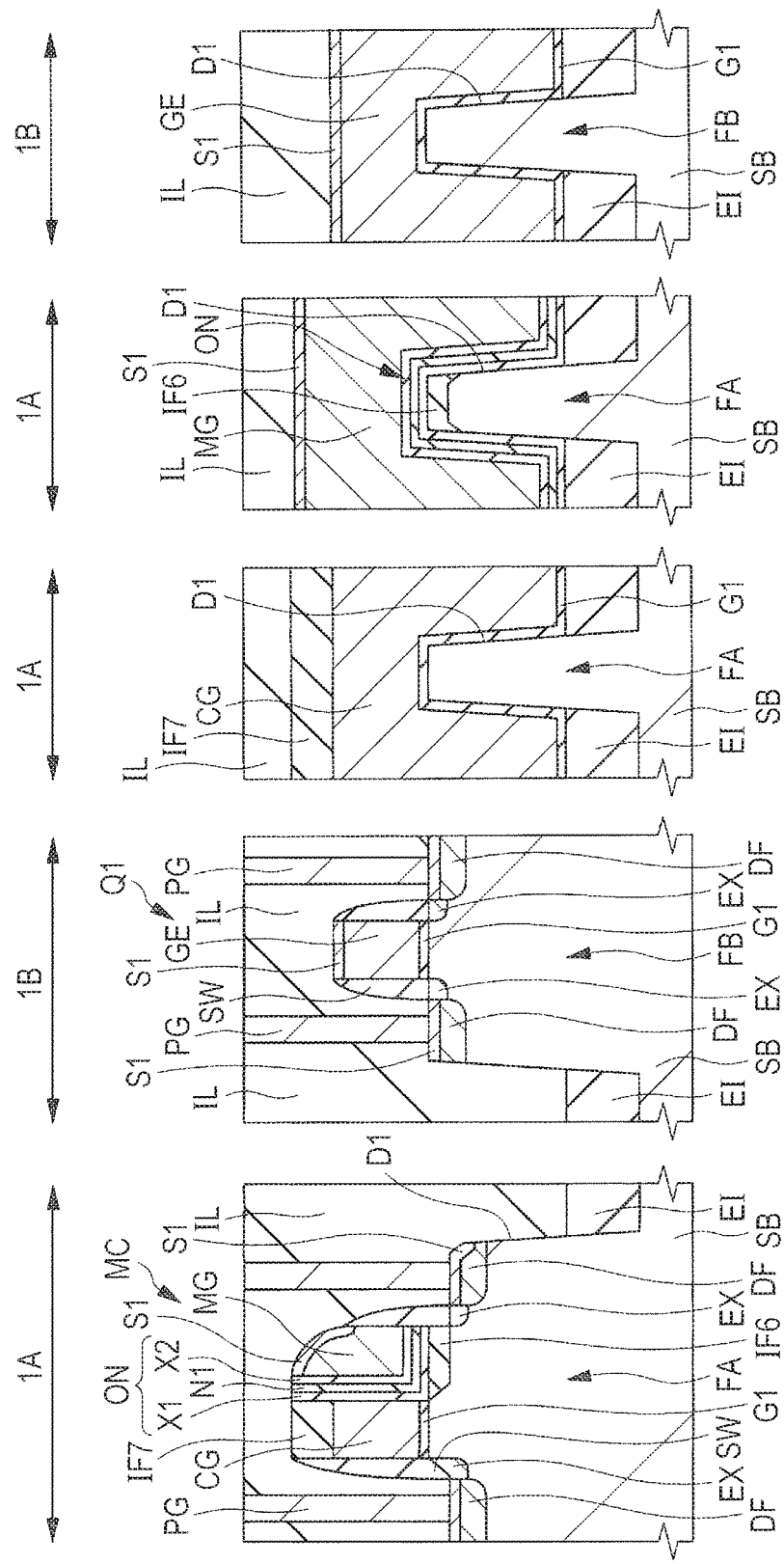
FIG. 26 includes sectional views explaining a manufacturing process of a semiconductor device of a third embodiment.

FIG. 26 shows sectional views of a semiconductor device of a third embodiment. FIG. 26 includes the sectional views, showing regions corresponding to those of FIG. 2. The structure shown in FIG. 26 is the same as the structure shown in FIG. 2 except that the insulating film IF6 is not formed directly below the control gate electrode CG, and that a position of the upper surface of the fin FA directly below the control gate electrode CG is higher than a position of the upper surface of the fin FA in any other region.

A manufacturing process to form such a structure is described with reference to FIGS. 27 to 31. FIGS. 27 to 31 each include sectional views explaining the manufacturing process of the semiconductor device of the third embodiment. FIGS. 27 to 31 each include sectional views showing the same regions as those of FIG. 26.

Figure 27:
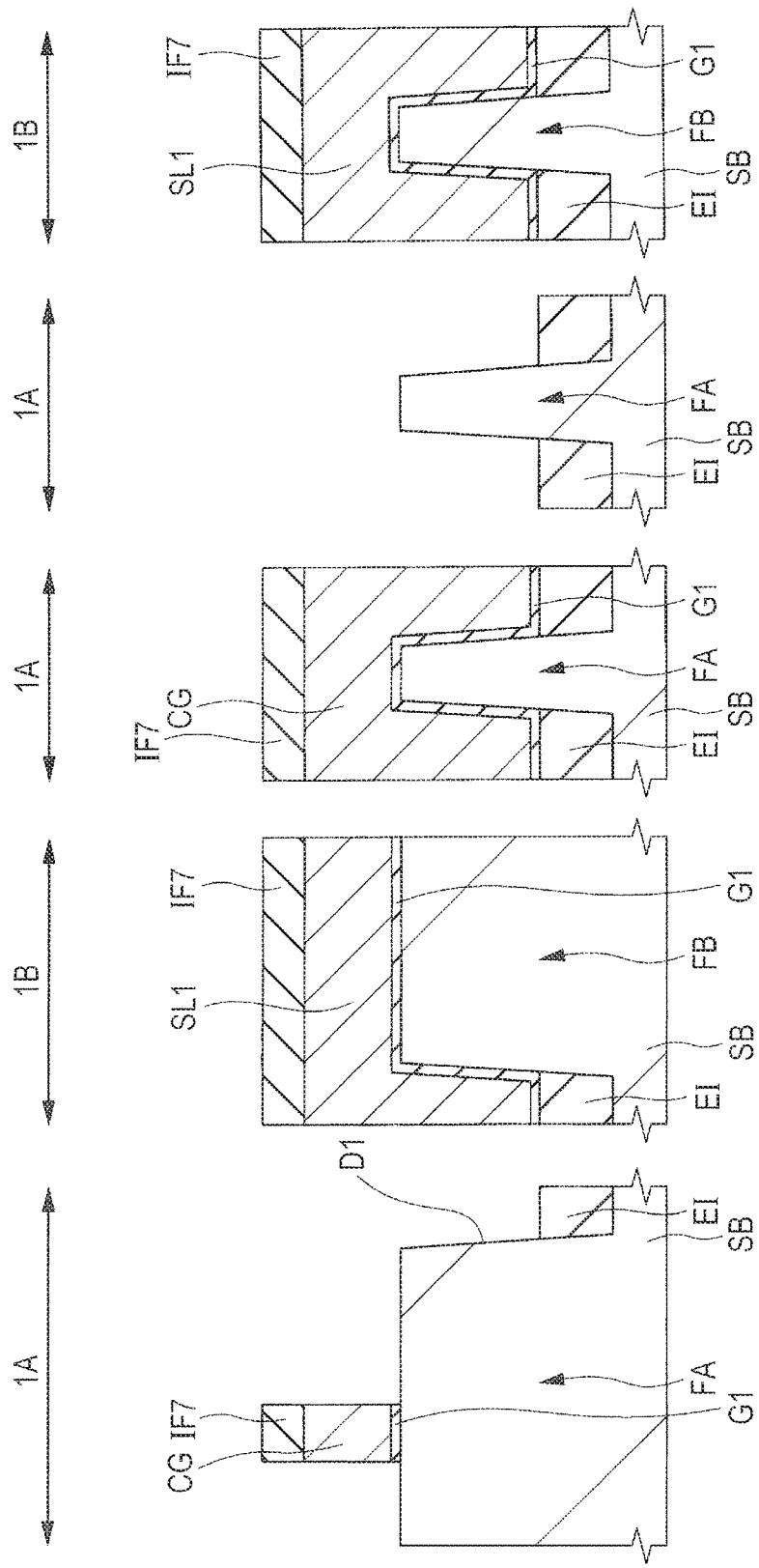
FIG. 27 includes sectional views explaining the manufacturing process of the semiconductor device following FIG. 26.

As shown in FIG. 27, first, steps similar to the steps described with reference to FIGS. 4 to 7 are performed. Subsequently, the steps described with reference to FIGS. and 13 are performed while the steps described with reference to FIGS. 8 to 11 are not performed, thereby the control gate electrode CG and the insulating film IF7 are stacked over the fin FA with the insulating film G1 as a gate insulating film in between. The upper surface of the fin FA is exposed beside a pattern including the insulating film G1, the control gate electrode CG, and the insulating film IF7. In the peripheral region 1B, a stacked film including the insulating film G1, the polysilicon film SL1, and the insulating film IF7 covers over the fin FB and the element isolation region EI.

Figure 28:
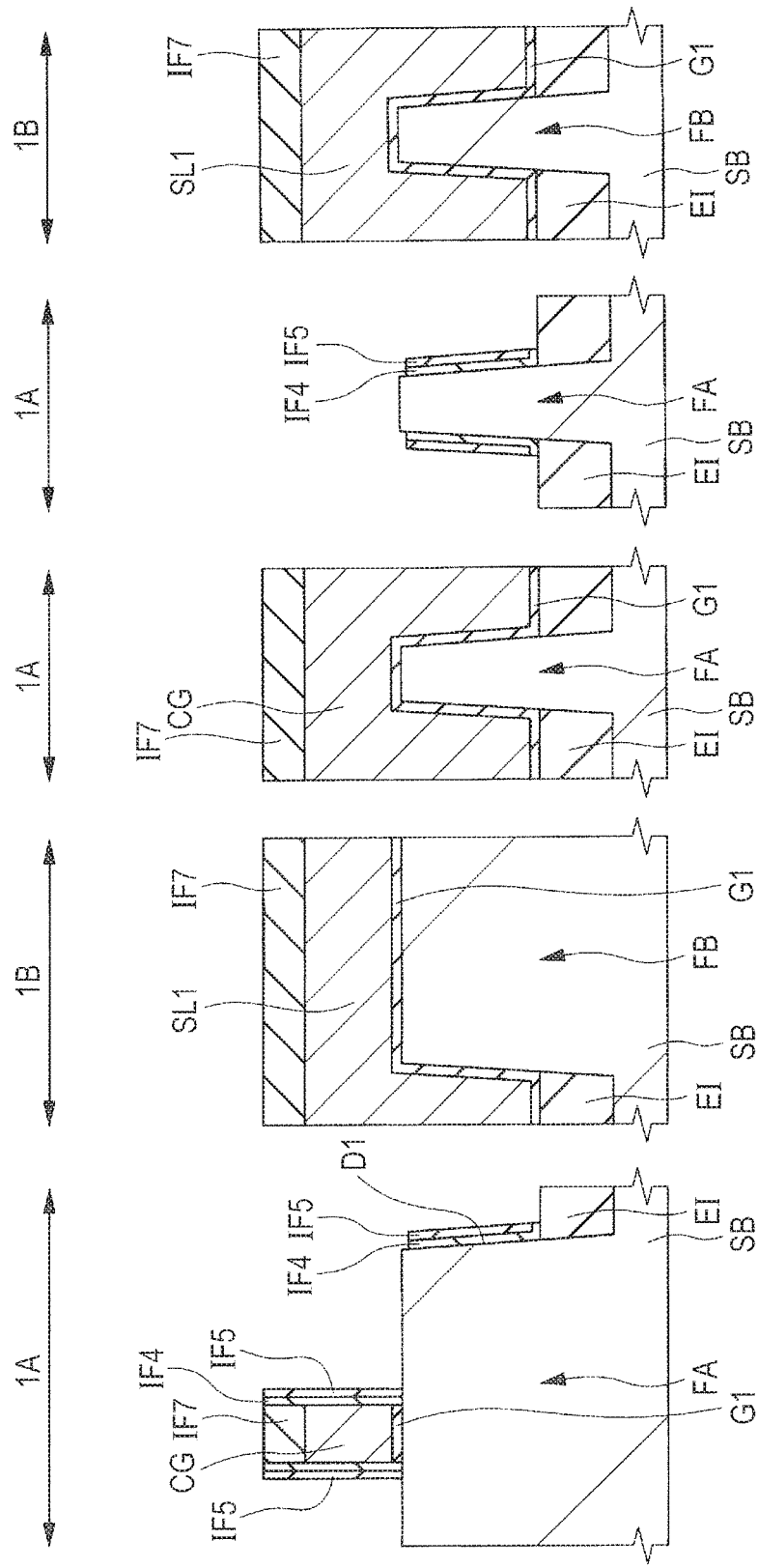
FIG. 28 includes sectional views explaining the manufacturing process of the semiconductor device following FIG. 27.

Subsequently, as shown in FIG. 28, steps similar to the steps described with reference to FIG. 8 are performed to stack the insulating films IF4 and IF5 in order over the semiconductor substrate SB. Subsequently, dry etching is performed to remove the insulating films IF4 and IF5 covering the respective upper surfaces of the fin FA, the insulating film IF7, and the element isolation region EI. As a result, the upper surface of the fin FA is exposed in the memory cell region 1A, and the respective upper surfaces of the insulating film IF7 and the element isolation region EI in each of the memory cell region 1A and the peripheral region 1B are exposed. That is, the stacked film including the insulating films IF4 and IF5 remains so as to cover the side surfaces of the pattern including the insulating film G1, the control gate electrode CG, and the insulating film IF7 and cover the side surfaces of the fin FA.

Figure 29:
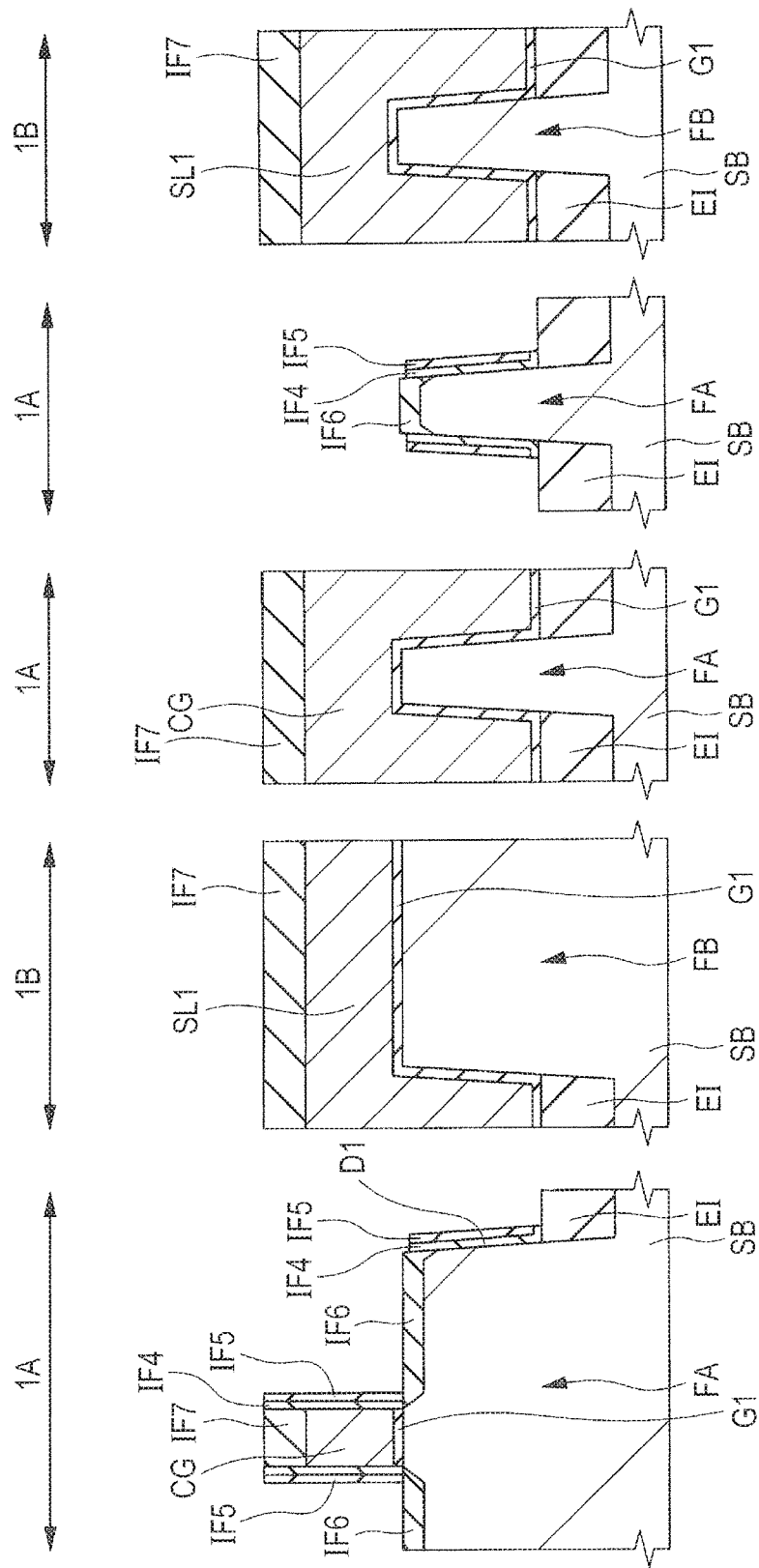
FIG. 29 includes sectional views explaining the manufacturing process of the semiconductor device following FIG. 28.

Subsequently, as shown in FIG. 29, dry oxidation is performed as with the step described with reference to FIG. 10, thereby the insulating film IF6 is formed in the upper surface of the fin FA exposed from the pattern including the control gate electrode CG and from the stacked film including the insulating films IF4 and IF5. The insulating film IF6 covers the upper surface of the fin FA. An end portion of the insulating film IF6 includes a bird's beak formed by oxidation of an upper end of the side surface of the fin FA covered with the stacked film including the insulating films IF4 and IF5. That is, the corner of the fin FA is rounded through such an oxidation step.

Since the fin FA directly below the control gate electrode CG is not oxidized, the insulating film IF6 is not formed directly below the control gate electrode CG. Part of the insulating film IF6 may also be formed directly below the stacked film including the insulating films IF4 and IF5 covering each side surface of the pattern including the control gate electrode CG. Since the fin FB in the peripheral region 1B is covered with the insulating film G1, the polysilicon film SL1, and the insulating film IF7, the insulating film IF6 in contact with the fin FB is not formed.

Figure 30:
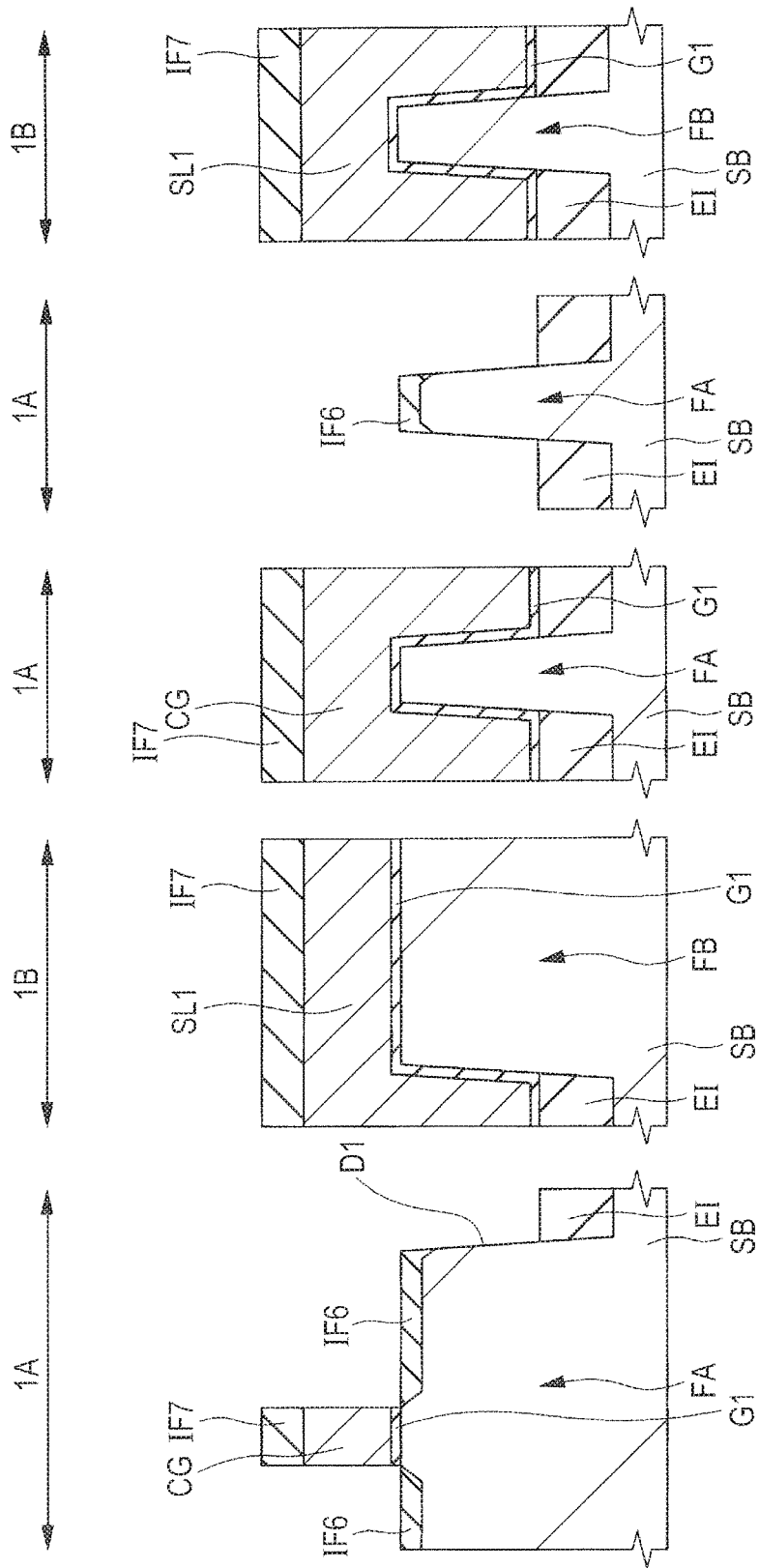
FIG. 30 includes sectional views explaining the manufacturing process of the semiconductor device following FIG. 29.

Subsequently, as shown in FIG. 30, the insulating films IF4 and IF5 are removed by etching, for example. As a result, the respective side surfaces of the control gate electrode CG, the insulating film IF7, and the fin FA are exposed.

Figure 31:
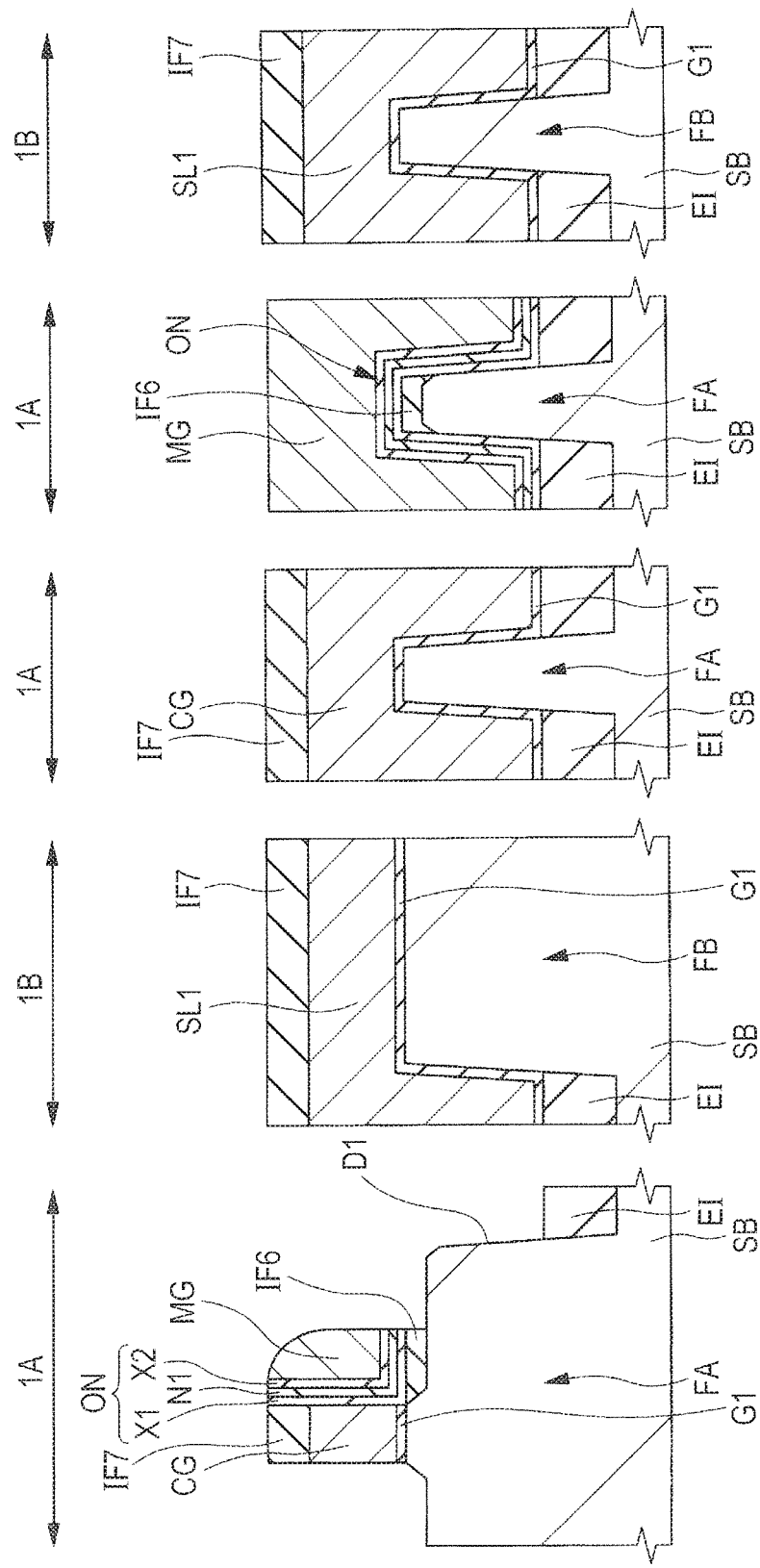
FIG. 31 includes sectional views explaining the manufacturing process of the semiconductor device following FIG. 30.

Subsequently, as shown in FIG. 31, steps similar to the steps described with reference to FIGS. 14 and 15 are performed to form the memory gate electrode MG adjacent to one side surface of the control gate electrode CG with the ONO film ON in between. The memory gate electrode MG is formed over the upper surface of the fin FA with the insulating film IF6 and the ONO film ON in between. Subsequently, for example, etching is performed to remove the insulating film IF6 exposed from the memory gate electrode MG and the ONO film ON. As a result, the upper surface of the fin FA is exposed. Subsequently, the insulating film IF6 exposed from the memory gate electrode MG and the ONO film ON is removed. As a result, the upper surface of the fin FA is exposed, and the insulating film IF6 remains only between the upper surface of the fin FA and a stack of the memory gate electrode MG and the ONO film ON.

Subsequently, steps similar to the steps described with reference to FIGS. 17 to 20 are performed to complete the semiconductor device shown in FIG. 26. The insulating film IF6 is never formed on the upper surface of the fin FA directly below the control gate electrode CG throughout the manufacturing process. Hence, the upper surface of the fin FA directly below the control gate electrode CG is located in a region higher than the upper surface of the fin FA in a region exposed from the control gate electrode CG. In other words, the upper surface of the fin FA directly below the control gate electrode CG protrudes upward with respect to the upper surface of the fin FA in the region exposed from the control gate electrode CG. The corner of the fin FA directly below the control gate electrode CG is not round, i.e., is angulate as with the corner of the fin FB. That is, the corner of the fin FA exposed from the memory gate electrode MG is round compared with the corner of the fin FA directly below the control gate electrode CG.

Effects of the third embodiment are described below.

In the third embodiment, as shown in FIG. 26, the thick insulating film IF6 is formed over the upper surface of the fin FA directly below the memory gate electrode MG. This makes it possible to reduce the electric field at the upper end of the fin FA. That is, it is possible to prevent electric field concentration at the upper end of the fin FA directly below the memory gate electrode MG. As a result, occurrence of the GPDL can be prevented. Even if electrons flow from the source region toward the semiconductor substrate SB due to the GIDL in an unselected cell, the large distance between the memory gate electrode MG and the upper surface of the fin FA directly below the memory gate electrode MG makes it possible to reduce the probability of trapping of electrons by the ONO film ON. It is therefore possible to prevent occurrence of the erroneous write phenomenon in which electrons are trapped by the ONO film ON in an unselected cell during write.

The corner of the fin FA is round due to formation of the bird's beak including the end portion of insulating film IF6, which makes it possible to reduce the electric field at the corner of the fin FA below the memory gate electrode MG. It is therefore possible to increase the gate withstand voltage, and prevent occurrence of the GIDL. Consequently, occurrence of the erroneous write can be prevented. In this way, reliability of the semiconductor device can be improved.

The insulating film IF6 is not formed on the upper surface of the fin FA directly below the control gate electrode CG, making it possible to prevent a reduction in a cell current flowing between the source and drain regions. It is therefore possible to achieve power saving of the semiconductor device, and improve reliability of the semiconductor device through preventing erroneous write.

Although the invention achieved by the inventors has been described in detail according to the embodiments hereinbefore, the invention should not be limited thereto, and it will be appreciated that various modifications or alterations thereof may be made within the scope without departing from the gist of the invention.

Some of the described contents of the embodiments are described below.

Supplementary Note 1

A semiconductor device, includes:

a semiconductor substrate;

a first protrusion that is a part of the semiconductor substrate, protrudes upward from an upper surface of the semiconductor substrate, and extends in a first direction along the upper surface of the semiconductor substrate;

a first gate electrode that covers an upper surface and side surfaces of the first protrusion with a first gate insulating film in between, and extends in a second direction orthogonal to the first direction;

a second gate electrode that covers the upper surface and the side surfaces of the first protrusion with a second gate insulating film including a charge storage part in between, and extends in the second direction alongside the first gate electrode; and first source-drain regions formed in the upper surface of the first protrusion, in which the second gate insulating film includes:

a first insulating film formed between the upper surface of the first protrusion and the second gate electrode, and exposing the side surfaces of the first protrusion; and a second insulating film that covers an upper surface of the first insulating film and the side surfaces of the first protrusion, and includes the charge storage part, where the first gate electrode, the second gate electrode, and the first source-drain regions configure a nonvolatile memory element, and where a second thickness of an end portion in the second direction of the first insulating film is larger than a first thickness of a central portion in the second direction of the first insulating film.

Supplementary Note 2

A method of manufacturing a semiconductor device includes the steps of:

(a) providing a semiconductor substrate;

(b) forming a first trench in an upper surface of the semiconductor substrate to form a first protrusion that is a part of the semiconductor substrate, protrudes from the upper surface of the semiconductor substrate, and extends in a first direction along the upper surface of the semiconductor substrate;

(c) forming a first gate electrode that covers an upper surface and side surfaces of the first protrusion with a first gate insulating film in between, and extends in a second direction orthogonal to the first direction;

(d) after the step (c), forming a fourth insulating film covering the side surfaces of the first protrusion;

(e) after the step (d), oxidizing the first protrusion exposed from the first gate electrode and the fourth insulating film to form a first insulating film covering the upper surface of the first protrusion;

(f) after the step (e), removing the fourth insulating film;

(g) after the step (f), forming a second gate electrode that covers the upper surface of the first insulating film and the side surfaces of the first protrusion with a second gate insulating film including a charge storage part in between, and extends in the second direction alongside the first gate electrode;

(h) removing the first insulating film exposed from the second gate electrode; and (i) forming first source-drain regions in the upper surface of the first protrusion, where the first gate electrode, the second gate electrode, and the first source-drain regions configure a nonvolatile memory element.

What is claimed is:

1. A semiconductor device, comprising:

a semiconductor substrate;

a first protrusion that is a part of the semiconductor substrate, protrudes from an upper surface of a first region of the semiconductor substrate, and extends in a first direction along the upper surface of the semiconductor substrate; and a first gate electrode that covers an upper surface and side surfaces of the first protrusion via a first gate insulating film, and extends along the upper surface of the semiconductor substrate and in a second direction orthogonal to the first direction wherein the first gate insulating film includes:

a first insulating film formed between the upper surface of the first protrusion and the first gate electrode, and exposing the side surfaces of the first protrusion; and a second insulating film that covers the side surfaces of the first protrusion and the first insulating film, wherein the first gate electrode configures a nonvolatile memory element, and wherein a second thickness of an end portion in the second direction of the first insulating film is larger than a first thickness of a central portion in the second direction of the first insulating film.

2. The semiconductor device according to claim 1, wherein the first thickness is 5 to 10 nm.

3. The semiconductor device according to claim 1, further comprising:
a second gate electrode that cover the upper surface and the side surfaces of the first protrusion via a second gate insulating film including a charge storage part, and extends in the second direction alongside the first gate electrode.

4. The semiconductor device according to claim 3, wherein the second gate insulating film includes:
the first insulating film formed from between the upper surface of the first protrusion and the first gate electrode to between the upper surface of the first protrusion and the second gate electrode; and
a third insulating film that covers an upper surface of the first insulating film and the side surfaces of the first protrusion, and includes the charge storage part, and
wherein thickness of the second gate insulating film covering the upper surface of the first protrusion is larger than thickness of the second gate insulating film covering the side surfaces of the first protrusion.

5. The semiconductor device according to claim 3, wherein the upper surface of the first protrusion directly below the second gate electrode is exposed from the first insulating film.

6. The semiconductor device according to claim 3, further comprising:
a plurality of second protrusions that are each a part of a second region of the semiconductor substrate, protrude from the upper surface of the semiconductor substrate, and extend in a third direction along the upper surface of the semiconductor substrate; and
a transistor including a third gate electrode formed over the upper surface of the second protrusion with a third gate insulating film in between and extending in the second direction, and second source-drain regions formed in the upper surface of the second protrusion,
wherein the first thickness of the first insulating film is larger than a third thickness of the third gate insulating film covering the upper surface of the second protrusion.

7. The semiconductor device according to claim 6, wherein an uppermost surface of the first protrusion is lower than an uppermost surface of the second protrusion.

8. The semiconductor device according to claim 6, wherein a corner of the first protrusion has a larger curvature radius than a corner of the second protrusion.

9. A semiconductor device, comprising:
a semiconductor substrate;
a first protrusion that is a part of the semiconductor substrate, protrudes upward from an upper surface of a first region of the semiconductor substrate, and extends in a first direction along the upper surface of the semiconductor substrate;
a first gate electrode that covers an upper surface and side surfaces of the first protrusion with a first gate insulating film in between, and extends along the upper surface of the semiconductor substrate and in a second direction orthogonal to the first direction;
the first gate insulating film formed between the first protrusion and the first gate electrode, and covering the upper surface of the first protrusion and the side surfaces of the first protrusion;
a second gate electrode that covers the upper surface and the side surfaces of the first protrusion with a second gate insulating film including a charge storage part in between, and extends in the second direction alongside the first gate electrode; and
first source-drain regions formed in the upper surface of the first protrusion,
wherein the first gate electrode, the second gate electrode, and the first source-drain regions configure a nonvolatile memory element, and
wherein thickness of the first gate insulating film covering the upper surface of the first protrusion is larger than thickness of the first gate insulating film covering the side surfaces of the first protrusion.

10. The semiconductor device according to claim 9, wherein part of the first gate insulating film is contained in a region surrounded by a first line that is along one of two side surfaces as the side surfaces of the first protrusion and orthogonal to the first direction, a second line that is along the other of the two side surfaces of the first protrusion and orthogonal to the first direction, a third line passing on an uppermost surface of the first protrusion and along the second direction, and a fourth line along the upper surface of the semiconductor substrate and along the second direction.

* * * * *